(12) United States Patent
Ohnuma

(10) Patent No.: US 8,030,174 B2
(45) Date of Patent: Oct. 4, 2011

(54) METHOD FOR MANUFACTURING SOI SUBSTRATE

(75) Inventor: Hideto Ohnuma, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/632,060

(22) Filed: Dec. 7, 2009

(65) Prior Publication Data

US 2010/0087046 A1    Apr. 8, 2010

Related U.S. Application Data

(62) Division of application No. 12/078,211, filed on Mar. 28, 2008, now Pat. No. 7,666,757.

(30) Foreign Application Priority Data

May 17, 2007    (JP) ................................. 2007-132085

(51) Int. Cl.
    *H01L 21/30*    (2006.01)
(52) U.S. Cl. ................. 438/455; 438/458; 257/E21.568
(58) Field of Classification Search .................. 438/455, 438/458; 257/E21.568
    See application file for complete search history.

(56) References Cited

U.S. PATENT DOCUMENTS

| | | | |
|---|---|---|---|
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,803,264 B2 | 10/2004 | Yamazaki et al. | |
| 6,818,529 B2 | 11/2004 | Bachrach et al. | |
| 6,818,921 B2 | 11/2004 | Yasukawa | |
| 6,900,113 B2 * | 5/2005 | Nakano et al. | 438/455 |
| 6,958,284 B2 | 10/2005 | Ghyselen | |
| 7,052,974 B2 * | 5/2006 | Mitani et al. | 438/459 |
| 7,199,024 B2 | 4/2007 | Yamazaki | |
| 7,268,051 B2 | 9/2007 | Couillard et al. | |
| 7,407,891 B2 | 8/2008 | Bauer et al. | |
| 2004/0038505 A1 | 2/2004 | Ito et al. | |
| 2005/0233544 A1 | 10/2005 | Ghyselen | |

(Continued)

FOREIGN PATENT DOCUMENTS

FR    2860842    4/2005

(Continued)

OTHER PUBLICATIONS

Search Report (Application No. 08005876.1) Dated Feb. 24, 2010.

*Primary Examiner* — Trung Q Dang
(74) *Attorney, Agent, or Firm* — Eric J. Robinson; Robinson Intellectual Property Law Office, P.C.

(57) ABSTRACT

An object is to provide a method for manufacturing an SOI substrate, by which defective bonding can be prevented. An embrittled layer is formed in a region of a semiconductor substrate at a predetermined depth; an insulating layer is formed over the semiconductor substrate; the outer edge of the semiconductor substrate is selectively etched on the insulating layer side to a region at a greater depth than the embrittled layer; and the semiconductor substrate and a substrate having an insulating surface are superposed on each other and bonded to each other with the insulating layer interposed therebetween. The semiconductor substrate is heated to be separated at the embrittled layer while a semiconductor layer is left remaining over the substrate having an insulating surface.

3 Claims, 28 Drawing Sheets

U.S. PATENT DOCUMENTS

| | | |
|---|---|---|
| 2006/0019465 A1 | 1/2006 | Guidry |
| 2006/0068565 A1 | 3/2006 | Droes et al. |
| 2006/0073678 A1 | 4/2006 | Droes et al. |
| 2007/0020947 A1 | 1/2007 | Daval et al. |
| 2007/0072393 A1 | 3/2007 | Aspar et al. |
| 2007/0122998 A1 | 5/2007 | Droes et al. |
| 2009/0023267 A1 | 1/2009 | Daval et al. |
| 2009/0045461 A1 | 2/2009 | Droes et al. |

FOREIGN PATENT DOCUMENTS

| | | |
|---|---|---|
| JP | 11-163363 | 6/1999 |
| JP | 2000-124092 | 4/2000 |
| WO | WO-2005/038903 | 4/2005 |

* cited by examiner

FIG. 7A1 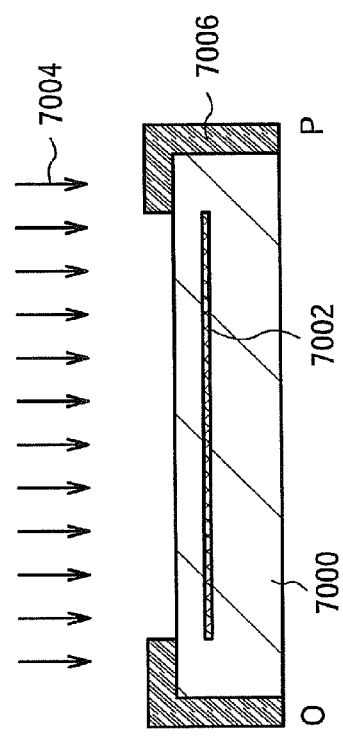 FIG. 7A2 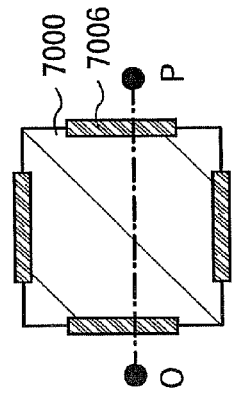
FIG. 7B1 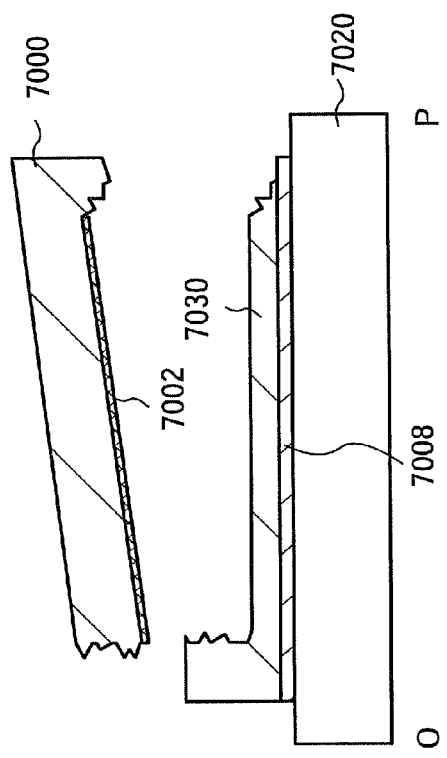 FIG. 7B2 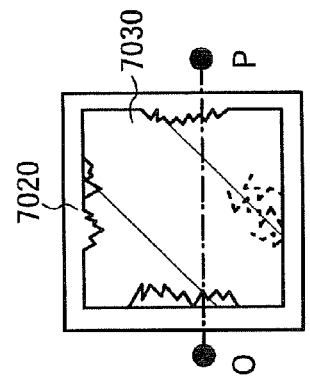

FIG. 17A
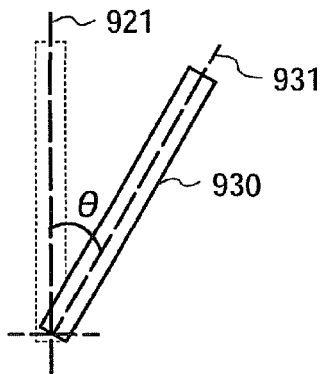
FIG. 17B1    FIG. 17B2    FIG. 17B3
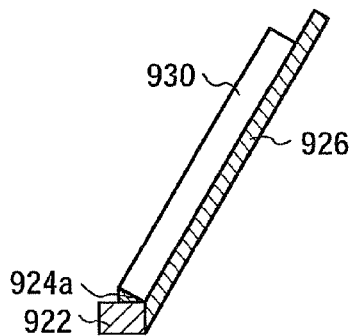 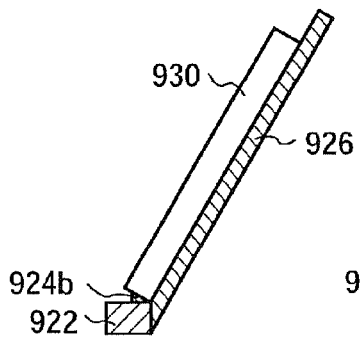 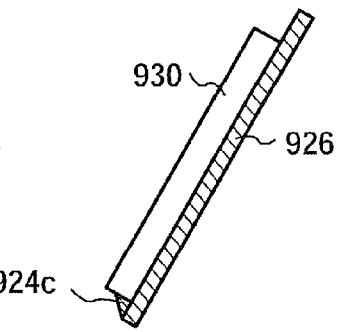
FIG. 17C
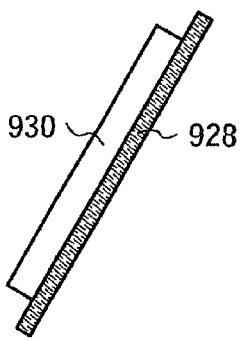
FIG. 17D
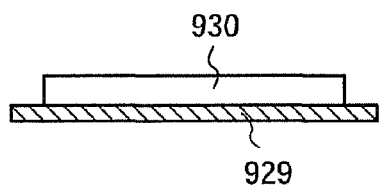

FIG. 19A1
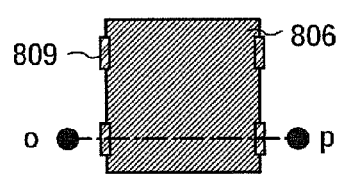
FIG. 19A2
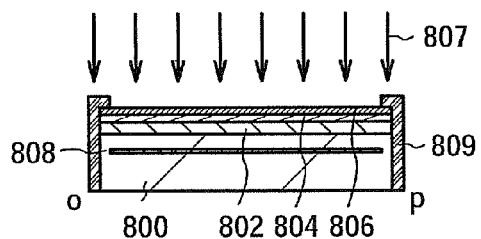
FIG. 19B1
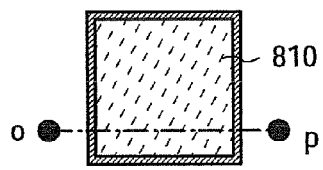
FIG. 19B2
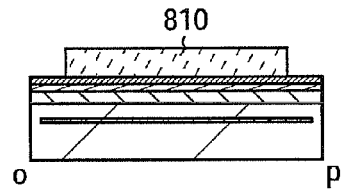
FIG. 19C1
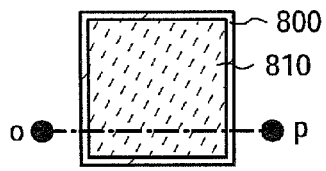
FIG. 19C2
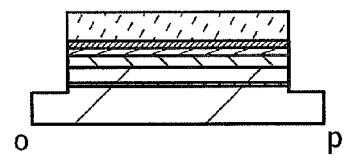
FIG. 19D1
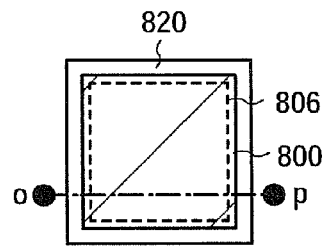
FIG. 19D2
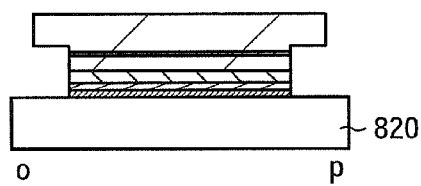
FIG. 19E1
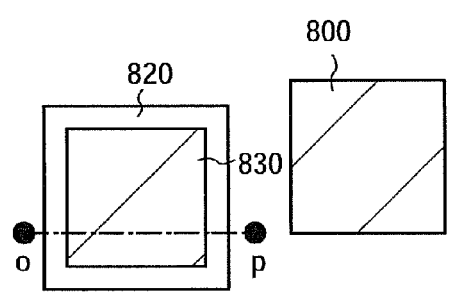
FIG. 19E2
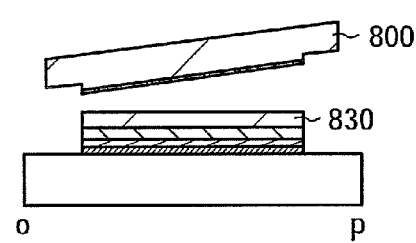

FIG.28

| Acceleration Voltage | hydrogen element (H) ratio (X : Y) | Ratio of ion species (X : Y/3) |
|---|---|---|
| 80 k V | 1 : 44.1 | 1 : 14.7 |
| 60 k V | 1 : 42.5 | 1 : 14.2 |
| 40 k V | 1 : 43.5 | 1 : 14.5 |

METHOD FOR MANUFACTURING SOI SUBSTRATE

BACKGROUND OF THE INVENTION

1. Field of the Invention

The present invention relates to a silicon-on-insulator (SOI) substrate. The present invention particularly relates to bonding SOI technology and relates to a method for manufacturing an SOI substrate by bonding of a single-crystal or polycrystalline semiconductor layer to a substrate having an insulating surface such as a glass substrate. The present invention also relates to a doping apparatus for ion irradiation.

2. Description of the Related Art

With the development of VLSI technology, higher integration, higher speed, and less power consumption are strongly demanded, and in order to achieve these, SOI structures attract attention. This technology allows an active region (channel formation region) of a field-effect transistor (FET), which has been formed of bulk single-crystal silicon, to be formed of a single-crystal silicon thin film. It is known that a MOS field-effect transistor manufactured using an SOI structure has lower parasitic capacitance than that manufactured using a conventional bulk single-crystal silicon substrate, which is an advantage in increasing speed.

Examples of SOI substrates include SIMOX substrates and bonded substrates. For example, an SOI structure of a SIMOX substrate is obtained by implantation of oxygen ions into a single-crystal silicon substrate and by heat treatment performed at 1300° C. or higher to form a buried oxide (BOX) layer, whereby a single-crystal silicon layer is formed on the surface. For a SIMOX substrate, oxygen ion implantation can be controlled precisely and thus a single-crystal silicon thin film having an even thickness can be formed with high control; however, there are problems with time and costs because a long period of time is needed for oxygen ion implantation. In addition, there is another problem in that a single-crystal silicon layer is likely to be damaged during oxygen ion implantation.

An SOI structure of bonded substrates is obtained by bonding of two single-crystal silicon substrates (a base substrate and a bond substrate) to each other with an insulating layer interposed therebetween and by thinning of one of the two single-crystal silicon substrates (the bond substrate), whereby a single-crystal silicon layer is formed. As a thinning method, a hydrogen ion implantation separation method is known. A hydrogen ion implantation separation method is a method in which hydrogen ions are implanted into a silicon substrate to form a microbubble layer at a predetermined depth from the substrate surface, and using the microbubble layer as a cleavage surface, a thin single-crystal silicon layer can be bonded to another substrate (see Reference 1: Japanese Published Patent Application No. 2000-124092).

On the other hand, there is an attempt to form a single-crystal silicon layer over a substrate having an insulating surface such as a glass substrate. For example, one known example of SOI substrates in which a single-crystal silicon layer is formed over a glass substrate is disclosed by the present applicant (see Reference 2: Japanese Published Patent Application No. H11-163363).

SUMMARY OF THE INVENTION

In manufacture of bonded SOI substrates, there are cases where a semiconductor substrate warps or bends. In particular, the outer edge of a substrate is likely to warp or bend. In implantation of hydrogen by hydrogen ion irradiation, there are cases where hydrogen cannot be sufficiently implanted into the outer edge of a semiconductor substrate. If bonding of such a semiconductor substrate is attempted, there may occur defective bonding such as a decrease in bonding strength due to poor contact with a supporting substrate; partial loss of a semiconductor layer, which is desired to be left remaining over a supporting substrate, caused by separation thereof together with the semiconductor substrate; or partial remaining of a semiconductor substrate, which is desired to be separated, over the supporting substrate. When a semiconductor substrate and a substrate of a different kind, such as a glass substrate, are bonded together, defective bonding may occur due to a difference in tendency to warp or bend between the substrates and due to poor contact.

In view of the above problems, it is an object of the present invention to provide a method for manufacturing an SOI substrate and an SOI substrate, in which defective bonding can be prevented. It is another object of the present invention to provide a doping apparatus with which an SOI substrate can be manufactured while preventing defective bonding.

An SOI substrate is manufactured by transfer of a semiconductor layer, which is separated from a semiconductor substrate, to a supporting substrate. After ions are implanted into a semiconductor substrate, which is the base of a semiconductor layer, to form an ion-implanted layer in a region at a predetermined depth, the outer edge of the semiconductor substrate is selectively etched to a region at a greater depth than the ion-implanted layer. The semiconductor substrate and a supporting substrate are superposed on each other and bonded to each other with a bonding layer interposed therebetween. By heat treatment, the semiconductor substrate is separated at the ion-implanted layer and the semiconductor layer is left remaining over the supporting substrate, whereby an SOI substrate is manufactured.

Note that "to implant ions" in this specification means irradiation of a semiconductor substrate with ions, which are accelerated by an electric field, so that an element of the ions used for the irradiation are contained in the semiconductor substrate. An "ion-implanted layer" in this specification is a region which is embrittled to have microvoids by irradiation of a semiconductor substrate with ions, and hereinafter, an "ion-implanted layer" is referred to as an "embrittled layer". By separation at an embrittled layer through later heat treatment, a semiconductor layer can be formed over a supporting substrate. In addition, an "outer edge" of a substrate in this specification means a region with a predetermined width inward from the outermost edge of the substrate.

A "bonding layer" in this specification refers to a layer which is formed on a bonding surface that is to form a bond with a supporting substrate (or an insulating layer formed over a supporting substrate). Specifically, as a bonding layer, a silicon oxide layer or an insulating layer having siloxane bonds is preferable used. Note that a bonding layer may be formed over a semiconductor substrate after an embrittled layer is formed in the semiconductor substrate, or an embrittled layer may be formed after a bonding layer is formed over a semiconductor substrate. Alternatively, a bonding layer may be formed over a supporting substrate.

One aspect of the present invention is a method for manufacturing an SOI substrate, in which an embrittled layer is formed in a region of a semiconductor substrate at a predetermined depth; an insulating layer is formed over the semiconductor substrate; the outer edge of the semiconductor substrate is selectively etched on the insulating layer side to a region at a greater depth than the embrittled layer; the semiconductor substrate and a substrate having an insulating surface are superposed on each other and bonded to each other with the insulating layer interposed therebetween; and the semiconductor substrate is heated to be separated at the embrittled layer while a semiconductor layer is left remaining over the substrate having an insulating surface.

Note that cleavage in this specification refers to separation of a part of a semiconductor substrate at an embrittled layer, which is embrittled to have microvoids by irradiation with ions of hydrogen, deuterium, helium, or a halogen such as fluorine, to form a semiconductor layer over a supporting substrate. In addition, a cleavage surface refers to a separation surface of a semiconductor layer which is provided over a substrate having an insulating surface by separation (a surface on the side opposite to the substrate having an insulating surface).

Another aspect of the present invention is a method for manufacturing an SOI substrate, in which an embrittled layer is formed in a region of a semiconductor substrate at a predetermined depth from a surface on which an insulating layer is formed; the outer edge of the semiconductor substrate is selectively etched on the insulating layer side to a region at a greater depth than the embrittled layer; the semiconductor substrate and a substrate having an insulating surface are superposed on each other and bonded to each other with the insulating layer interposed therebetween; and the semiconductor substrate is heated to be separated at the embrittled layer while a semiconductor layer is left remaining over the substrate having an insulating surface.

According to each of the above aspects, between the semiconductor substrate and the insulating layer, a single-layer structure of a single layer or a stacked-layer structure of a plurality of layers selected from a silicon nitride layer, a silicon nitride oxide layer, and a silicon oxynitride layer can be formed. Any of these layers can be formed over the semiconductor substrate before the embrittled layer is formed in the semiconductor substrate. Alternatively, after the embrittled layer is formed in the semiconductor substrate, the silicon nitride layer, the silicon nitride oxide layer, or the silicon oxynitride layer mentioned above may be formed over the semiconductor substrate.

Another aspect of the present invention is a method for manufacturing an SOI substrate, in which an embrittled layer is formed in a region of a semiconductor substrate at a predetermined depth; the outer edge of the semiconductor substrate is selectively etched to a region at a greater depth than the embrittled layer; an insulating layer is formed over a substrate having an insulating surface; the semiconductor substrate and the substrate having an insulating surface are superposed on each other and bonded to each other with the insulating layer interposed therebetween; and the semiconductor substrate is heated to be separated at the embrittled layer while a semiconductor layer is left remaining over the substrate having an insulating surface.

According to the above aspect, between the substrate having an insulating surface and the insulating layer, a single-layer structure of a single layer or a stacked-layer structure of a plurality of layers selected from a silicon nitride layer, a silicon nitride oxide layer, and a silicon oxynitride layer can be formed.

As a layer formed at a bonding interface as the bonding layer, a silicon oxide layer or an insulating layer having siloxane bonds is preferable formed. In particular, when a silicon oxide layer is formed as a bonding layer, it is preferably formed by a chemical vapor deposition method using organic silane as a source gas. Organic silane can be any one of tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris-dimethylaminosilane (chemical formula: $SiH(N(CH_3)_2)_3$).

Note that a chemical vapor deposition (CVD) method in this specification includes a plasma CVD method, a thermal CVD method, and a photo-CVD method.

A silicon oxide layer which functions as the bonding layer can also be formed by a chemical vapor deposition method using monosilane, disilane, or trisilane as a source gas.

Another aspect of the present invention is a method for manufacturing an SOI substrate, in which an embrittled layer is formed in a region of a semiconductor substrate at a predetermined depth; a first insulating layer is formed over the semiconductor substrate; the outer edge of the semiconductor substrate is selectively etched on the first insulating layer side to a region at a greater depth than the embrittled layer; a second insulating layer is formed over a substrate having an insulating surface; the semiconductor substrate and the substrate having an insulating surface are superposed on each other and bonded to each other with the first insulating layer and the second insulating layer interposed therebetween; and the semiconductor substrate is heated to be separated at the embrittled layer while a semiconductor layer is left remaining over the substrate having an insulating surface.

Another aspect of the present invention is a method for manufacturing an SOI substrate, in which an embrittled layer is formed in a region of a semiconductor substrate at a predetermined depth from a surface on which a first insulating layer is formed; the outer edge of the semiconductor substrate is selectively etched on the first insulating layer side to a region at a greater depth than the embrittled layer; a second insulating layer is formed over a substrate having an insulating surface; the semiconductor substrate and the substrate having an insulating surface are superposed on each other and bonded to each other with the first insulating layer and the second insulating layer interposed therebetween; and the semiconductor substrate is heated to be separated at the embrittled layer while a semiconductor layer is left remaining over the substrate having an insulating surface.

According to each of the above aspects, between the semiconductor substrate and the first insulating layer, a single-layer structure of a single layer or a stacked-layer structure of a plurality of layers selected from a silicon nitride layer, a silicon nitride oxide layer, and a silicon oxynitride layer can be formed. Any of these layers can be formed over the semiconductor substrate before the embrittled layer is formed in the semiconductor substrate. Alternatively, any of these layers may be formed over the semiconductor substrate after the embrittled layer is formed in the semiconductor substrate.

Between the substrate having an insulating surface and the second insulating layer, a single-layer structure of a single layer or a stacked-layer structure of a plurality of layers selected from a silicon nitride layer, a silicon nitride oxide layer, and a silicon oxynitride layer can be formed.

As the first insulating layer or the second insulating layer, a silicon oxide layer or an insulating layer having siloxane bonds is preferably formed. In particular, when a silicon oxide layer is formed, it is preferably formed by a chemical vapor deposition method using organic silane as a source gas. Organic silane can be any one of tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: SiH(OC$_2$H$_5$)$_3$), and trisdimethylaminosilane (chemical formula: SiH(N(CH$_3$)$_2$)$_3$).

A silicon oxide layer which functions as the first insulating layer or the second insulating layer can also be formed by a chemical vapor deposition method using monosilane, disilane, or trisilane as a source gas.

The embrittled layer can be formed by irradiation with ions of atoms of a single kind or a plurality of kinds that have different masses. Examples of ions that have different masses include H$^+$ ions, H$_2$$^+$ ions, and H$_3$$^+$ ions.

The etching of the outer edge of the semiconductor substrate can be performed by a wet etching method, a dry etching method, or a combination of a wet etching method and a dry etching method.

The heating in separating the semiconductor substrate at the embrittled layer is preferably performed at a temperature ranging from 400° C. to lower than 700° C.

Another aspect of the present invention is a doping apparatus including an ion irradiation mechanism for irradiating a process substrate with an ion beam, a substrate holding mechanism for holding the process substrate in a tilted position, and a control mechanism for controlling the incidence angle of the ion beam with which the process substrate is irradiated. The substrate holding mechanism preferably holds the process substrate against it.

According to the above aspect, the substrate holding mechanism can be configured to have a mounting portion for supporting the bottom of the process substrate and a back supporting portion which is tilted at a desired tilt angle of the process substrate and supports the backside of the process substrate. It is preferable that the process substrate be held against the back supporting portion provided in the substrate holding mechanism.

According to the above aspect, it is preferable that the tilt angle θ of the process substrate be in the range of 10°≦θ<90°, 30°≦θ<90°, or 45°≦θ<90° or in the range of 10°≦θ≦90°, 30°≦θ≦90°, or 45°≦θ≦90°.

The ion beam can include ions of atoms of a single kind or a plurality of kinds that have different masses. For example, an ion beam including H$^+$ ions, H$_2$$^+$ ions, and H$_3$$^+$ ions can be used. Note that it is preferable that the incidence angle of each ion beam be in the range of 80° to 100° and the average of incidence angles of ion beams be in the range of 85° to 95°.

By employing the method for manufacturing an SOI substrate or the ion doping apparatus of the present invention, defective bonding in manufacturing an SOI substrate can be prevented. Therefore, an SOI substrate can be manufactured with high yield.

BRIEF DESCRIPTION OF THE DRAWINGS

FIGS. 7A1 to 7B2 are diagrams showing an example of an ion irradiation step.

FIGS. 17A to 17D are diagrams showing a mode of substrate holding of a doping apparatus.

FIGS. 19A1 to 19E2 are top views and cross-sectional views showing a method for manufacturing an SOI substrate A by applying the present invention.

FIG. 28 is a list of ratios of fitting parameters (hydrogen atom ratios and hydrogen ion species ratios).

DETAILED DESCRIPTION OF THE INVENTION

Embodiment modes and embodiments of the present invention will be hereinafter described with reference to the drawings. However, the present invention is not limited to the following description, and it is easily understood by those skilled in the art that the mode and detail of the present invention can be variously changed without departing from the spirit and scope thereof. Therefore, the present invention should not be interpreted as being limited to the following description of the embodiment modes and embodiments. Note that, in the structures of the present invention given

Embodiment Mode 1

An SOI substrate of this mode is formed by transfer of a semiconductor layer, which is separated from a semiconductor substrate, to a supporting substrate. Specifically, after an embrittled layer is formed in a semiconductor substrate and the outer edge of the semiconductor substrate is selectively etched, the semiconductor substrate is bonded to a supporting substrate, and by heat treatment, the semiconductor substrate is separated at the embrittled layer while a semiconductor layer is left remaining over the supporting substrate. Note that, in this mode, a substrate of a different kind from the semiconductor substrate is used as the supporting substrate. Hereinafter, modes of an SOI substrate and a method for manufacturing the SOI substrate of this mode will be described.

FIGS. 1A to 1E are cross-sectional views showing an example of a method for manufacturing an SOI substrate according to the present invention. FIGS. 2A to 2E and 3A to 3E are top views showing an example of a method for manufacturing an SOI substrate according to the present invention. FIGS. 1A to 1E correspond to cross-sectional views of the top views shown in FIGS. 2A to 2E or 3A to 3E taken along chain line X-Y.

Figure 1A:
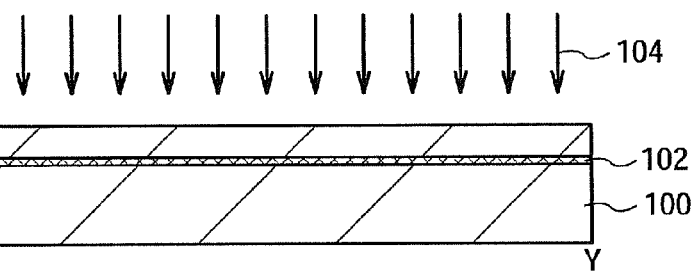
FIGS. 1A to 1E are diagrams showing an example of a method for manufacturing an SOI substrate.
Figure 2A:
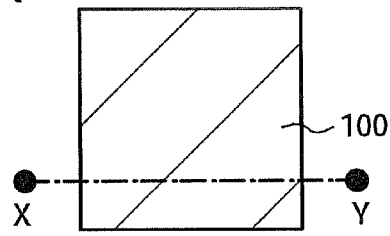
FIGS. 2A to 2E are diagrams showing an example of a method for manufacturing an SOI substrate.
Figure 3A:
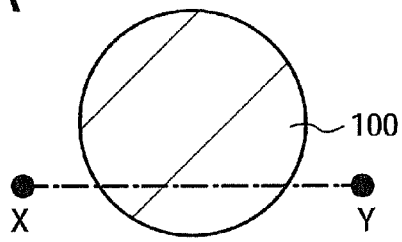
FIGS. 3A to 3E are diagrams showing an example of a method for manufacturing an SOI substrate.

A cleaned surface of a semiconductor substrate 100 is irradiated with ions 104, which are accelerated by an electric field, to form an embrittled layer 102 in a region at a predetermined depth from the surface of the semiconductor substrate 100 (see FIGS. 1A, 2A, and 3A).

As the semiconductor substrate 100, a semiconductor substrate such as a silicon substrate or a germanium substrate or a compound semiconductor substrate of gallium arsenide, indium phosphide, or the like is used. The semiconductor substrate 100 is preferably a single-crystal semiconductor substrate, but it may be a polycrystalline semiconductor substrate. Note that known semiconductor substrates have a rectangular shape or a circular shape. In this mode, FIGS. 2A to 2E show an example of top views of a manufacturing method when the semiconductor substrate 100 is rectangular. In addition, FIGS. 3A to 3E show an example of top views of a manufacturing method when the semiconductor substrate 100 is circular.

The depth of the embrittled layer 102 formed in the semiconductor substrate 100 is controlled by the kind of the ions 104 used for the irradiation, the accelerating voltage of the ions 104, and the irradiation angle of the ions 104. The embrittled layer 102 is formed in a region at a depth close to the average penetration depth of the ions from the surface of the semiconductor substrate 100. The depth of the embrittled layer 102 determines the thickness of a semiconductor layer to be transferred to a supporting substrate later. Therefore, the accelerating voltage at the time of the irradiation with the ions 104 and the dose of the ions 104 are adjusted in consideration of the thickness of a semiconductor layer to be transferred. Preferably, the thickness of a semiconductor layer is set to be 5 nm to 500 nm, more preferably, 10 nm to 200 nm.

The irradiation with the ions 104 is preferably performed using an ion doping apparatus. In other words, an ion doping method is preferably used, which performs irradiation with a plurality of kinds of ions that is generated by plasma excitation of a source gas without any mass separation being performed. In this mode, irradiation with ions of atoms of a single kind or a plurality of kinds that have different masses is preferable. Such ion doping may be performed with an accelerating voltage of 10 kV to 100 kV, preferably, 30 kV to 80 kV, at a dose of $1\times10^{16}$ ions/cm$^2$ to $4\times10^{16}$ ions/cm$^2$, and with a beam current density of 2 μA/cm$^2$ or more, preferably, 5 μA/cm$^2$ or more, more preferably, 10 μA/cm$^2$ or more.

As the ions 104, ions of hydrogen, deuterium, helium, or a halogen such as fluorine can be used. Note that, as the ions 104, irradiation with ions of atoms of a single kind or a plurality of kinds that have identical mass or with ions of atoms of a single kind or a plurality of kinds that have different masses, which are generated by plasma excitation of a source gas selected from hydrogen, deuterium, helium, and a halogen, can be performed. In the case of irradiation with ions of atoms of a single kind or a plurality of kinds that have different masses and irradiation with ions of hydrogen, it is preferable that the ions of hydrogen include H$^+$ ions, H$_2^+$ ions, and H$_3^+$ ions with a high proportion of H$_3^+$ ions because ion irradiation efficiency can be increased and irradiation time can be shortened. Accordingly, a region of the semiconductor substrate 100 where the embrittled layer 102 is formed can be made to contain hydrogen at $1\times10^{20}$ atoms/cm$^3$ (preferably, $1\times10^{21}$ atoms/cm$^3$) or more. Note that selective irradiation with only one kind of H$^+$ ions, H$_2^+$ ions, and H$_3^+$ ions may be performed. When a high-concentration hydrogen-irradiated region is locally formed in the semiconductor substrate 100, a crystal structure is disordered and microvoids are formed, whereby the embrittled layer 102 can be made to have a porous structure. In this case, by heat treatment at relatively low temperature, a change occurs in the volume of the microvoids formed in the embrittled layer 102. Then, cleavage occurs along the embrittled layer, which enables a semiconductor layer to be formed.

Note that the embrittled layer 102 can be formed in a similar manner even if the semiconductor substrate 100 is irradiated with ions with mass separation being performed. In this case, selective irradiation with ions having large mass (for example, H$_3^+$ ions) is also preferable.

Note that, in order to form the embrittled layer 102 at a predetermined depth, there are cases where the semiconductor substrate 100 is irradiated with the ions 104 at a high dose. At this time, depending on conditions, the surface of the semiconductor substrate 100 may be etched and roughened through ion irradiation. Therefore, a surface of the semiconductor substrate 100, which is to be irradiated with ions, may be provided with a dense film. For example, as a protective film against ion irradiation, a single-layer structure of a single layer or a stacked-layer structure of a plurality of layers selected from a silicon nitride layer, a silicon nitride oxide layer, and a silicon oxynitride layer can be provided. Such an insulating layer which functions as a protective layer may be provided at a thickness of 50 nm to 200 nm.

Figure 1B:
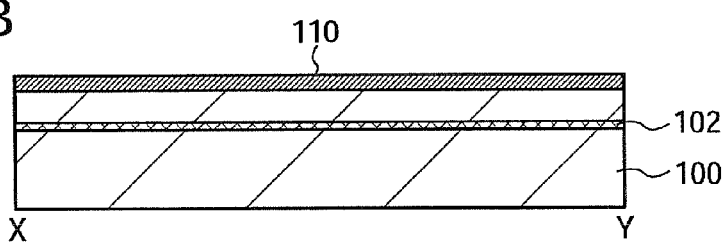
Figure 1C:
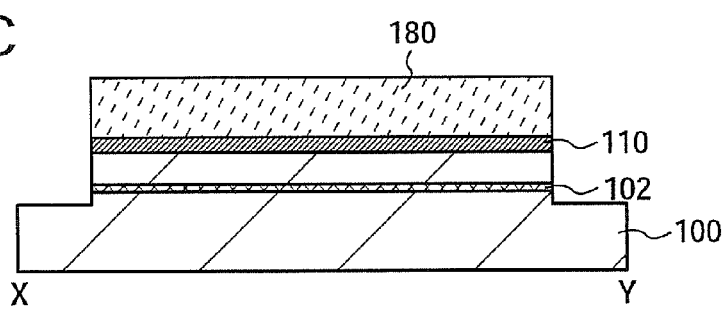
Figure 1D:
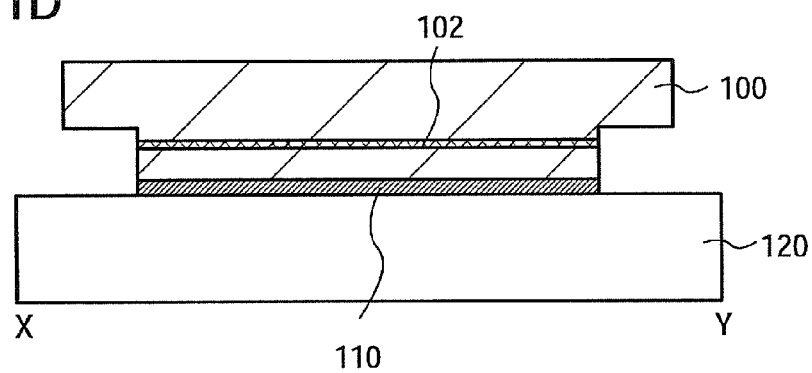
Figure 2B:
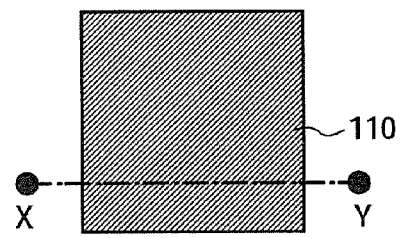
Figure 2C:
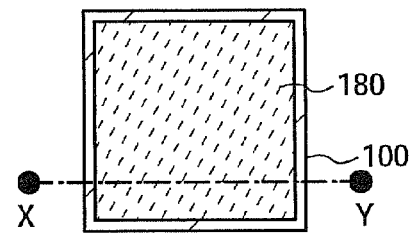
Figure 2D:
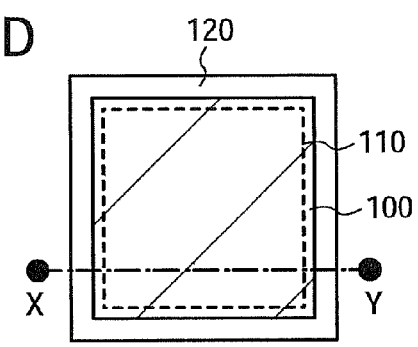
Figure 3B:
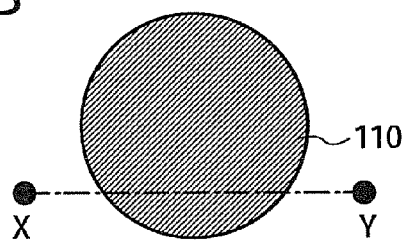
Figure 3C:
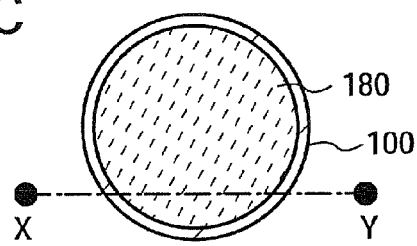
Figure 3D:
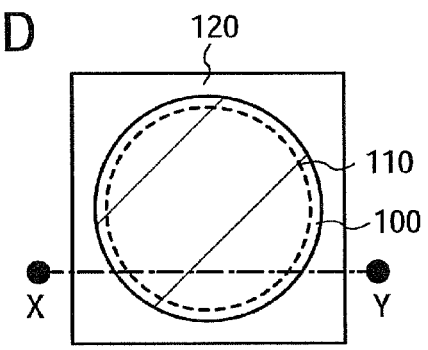

Next, a bonding layer 110 is formed on the semiconductor substrate 100 (see FIGS. 1B, 2B, and 3B). The bonding layer 110 is formed on a surface where the semiconductor substrate 100 forms a bond with a supporting substrate.

The bonding layer 110 is a layer which forms a bonding interface, and a film which has a smooth surface and can form a hydrophilic surface is preferably formed. The bonding layer 110 as described above is preferably an insulating layer formed by a chemical reaction. For example, an oxide film formed by a thermal or chemical reaction is suitable. This is because an insulating layer formed by a chemical reaction can easily ensure surface smoothness. The bonding layer 110 which has a smooth surface and forms a hydrophilic surface is preferably provided at a thickness of 0.2 nm to 500 nm. With the bonding layer 110 formed at a thickness within the above range, it is possible to smooth surface roughness of a surface on which a film is to be formed and also possible to ensure smoothness of the surface of the film.

When a single-crystal silicon substrate is used as the semiconductor substrate 100, a silicon oxide layer is suitable for the bonding layer 110. In particular, a silicon oxide layer which is formed by a chemical vapor deposition method using organic silane as a source gas is preferable. Examples of organic silane that can be used include silicon-containing compounds such as tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). Note that, when a silicon oxide layer is formed by a chemical vapor deposition method using organic silane as a source gas, an oxygen-containing gas is preferably mixed. As the oxygen-containing gas, oxygen, nitrous oxide, nitrogen dioxide, or the like can be used. In addition, an inert gas such as argon, helium, or nitrogen or hydrogen may be mixed. Alternatively, the bonding layer 110 can be a silicon oxide layer which is formed by a chemical vapor deposition method using silane such as monosilane, disilane, or trisilane as a source gas. In this case, it is also preferable that an oxygen-containing gas, an inert gas, or the like be mixed. The formation of the bonding layer 110 by a chemical vapor deposition method is performed at a temperature at which degassing of the embrittled layer 102 that is formed in the semiconductor substrate 100 does not occur. For example, the formation is performed at 350° C. or lower. Note that later heat treatment for separation of a semiconductor layer from the semiconductor substrate such as a single-crystal semiconductor substrate or a polycrystalline semiconductor substrate is performed at a temperature higher than the temperature at which the bonding layer 110 is formed by a chemical vapor deposition method. Note that a chemical vapor deposition method includes a plasma CVD method, a thermal CVD method, and a photo-CVD method.

Alternatively, the bonding layer 110 can be formed using a silicon oxide which is formed by heat treatment in an oxidizing atmosphere, a silicon oxide which grows by reaction of oxygen radicals, a chemical oxide which is formed with an oxidizing chemical solution, or the like. Still alternatively, the bonding layer 110 may be an insulating layer having siloxane (Si—O—Si) bonds.

Next, the outer edge of the semiconductor substrate 100 is selectively etched. At this time, the outer edge of the semiconductor substrate 100 is etched on the side where the semiconductor substrate 100 is to faun a bond with a supporting substrate to a region at a greater depth than the embrittled layer 102 (see FIGS. 1C, 2C, and 3C). By etching of the outer edge of the semiconductor substrate 100 to a region at a greater depth than the embrittled layer 102 in this manner, in a later step of transferring a semiconductor layer to a supporting substrate, a region of the semiconductor substrate 100 remaining in a projecting shape can be easily transferred. By etching in advance the outer edge of the substrate, that is, a region which is likely to warp, defective bonding to a supporting substrate can be prevented. Note that the etching of the outer edge of the semiconductor substrate 100 is performed so that a region deeper than the embrittled layer 102 remains. That is, a step is formed such that the outer edge of the semiconductor substrate 100 has a depressed shape. In a depressed region, the embrittled layer 102 is not present. If the outer edge of the semiconductor substrate 100 is totally removed by etching, the outer edge of the semiconductor substrate after the etching may warp or bend again. Therefore, the outer edge is preferably etched so that a part thereof remains.

In this mode, a mask layer 180 is selectively formed over the semiconductor substrate 100 with the bonding layer 110 interposed therebetween. A resist mask may be used as the mask layer 180, and for example, the mask layer 180 can be formed by coating of the entire surface of the semiconductor substrate with a resist and then by removal of the resist over the outer edge of the semiconductor substrate 100. Then, the semiconductor substrate 100 is etched using the mask layer 180 to a region at a greater depth than the embrittled layer 102. The etching may be performed by a wet etching method, a dry etching method, or a combination of a wet etching method and a dry etching method.

In this mode, the bonding layer 110 is formed on the semiconductor substrate 100, and the bonding layer 110 and the semiconductor substrate 100 including the embrittled layer 102 are selectively etched using the mask layer 180. For example, when a silicon oxide layer is formed as the bonding layer 110 and a single-crystal silicon substrate is used as the semiconductor substrate 100, the bonding layer 110 can be etched by wet etching, and then, the semiconductor substrate 100 can be etched by dry etching.

Next, after the mask layer 180 is removed, a supporting substrate 120 and the semiconductor substrate 100 are superposed on each other and bonded to each other with the bonding layer 110 interposed therebetween. In this mode, a bond is formed by making the supporting substrate 120 and the surface of the semiconductor substrate 100 where the bonding layer 110 is formed face each other and be in contact with each other (see FIGS. 1D, 2D, and 3D).

A surface which is to form a bond is sufficiently cleaned. Then, the supporting substrate 120 and the bonding layer 110 are located in contact with each other, whereby a bond is formed. It can be considered that Van der Waals forces act at the initial stage of bonding and that a strong bond due to hydrogen bonding can be formed by pressure bonding of the supporting substrate 120 and the semiconductor substrate 100.

Before the supporting substrate 120 and the semiconductor substrate 100 are located in contact with each other, one or both of the bonding surfaces may be cleaned with ozone-containing water, oxygen-containing water, hydrogen-containing water, pure water, or the like. Alternatively, the bonding surface may be subjected to ultrasonic cleaning or megasonic cleaning. Note that, when the bonding surface is cleaned, bonding is performed after drying.

In this mode, the outer edge of the semiconductor substrate 100 is selectively etched, and a region remaining in a projecting shape other than the etched outer edge is in contact with and forms a bond with the supporting substrate 120. In this mode, the outer edge of the semiconductor substrate which is likely to warp or bend is selectively etched in advance, and a region of the semiconductor substrate other than the outer edge is bonded to the supporting substrate. Therefore, it is easy to ensure sufficient bonding strength between the supporting substrate and the semiconductor substrate.

Note that, in order to form a favorable bond between the semiconductor substrate and the supporting substrate, one or both of the bonding surfaces may be activated. For example, the surface which is to form a bond is irradiated with an atomic beam or an ion beam. When an atomic beam or an ion beam is used, an inert gas neutral atom beam or inert gas ion beam of argon or the like can be used. Alternatively, the activation can be performed by plasma irradiation or radical treatment. Such a surface treatment makes it possible to increase bonding strength between different kinds of materials even at a temperature of 200° C. to 400° C.

As the supporting substrate 120, an insulating substrate or a substrate having an insulating surface is used. Specifically, various kinds of glass substrates (also referred to as "non-alkali glass substrates") that are used in the electronics industry, such as aluminosilicate glass substrates, aluminoborosilicate glass substrates, and barium borosilicate glass substrates, quartz substrates, ceramic substrates, sapphire substrates, metal substrates with their surfaces covered with an insulating layer, and the like can be used.

Note that it is preferable that heat treatment or pressure treatment be performed after the supporting substrate 120 and the semiconductor substrate 100 are bonded to each other. Heat treatment or pressure treatment makes it possible to increase bonding strength. The heat treatment is preferably performed at a temperature equal to or lower than the upper temperature limit of the supporting substrate 120. The pressure treatment is performed so that pressure is applied perpendicular to the bonding surface, in consideration of the pressure resistance of the supporting substrate 120 and the semiconductor substrate 100.

Figure 1E:
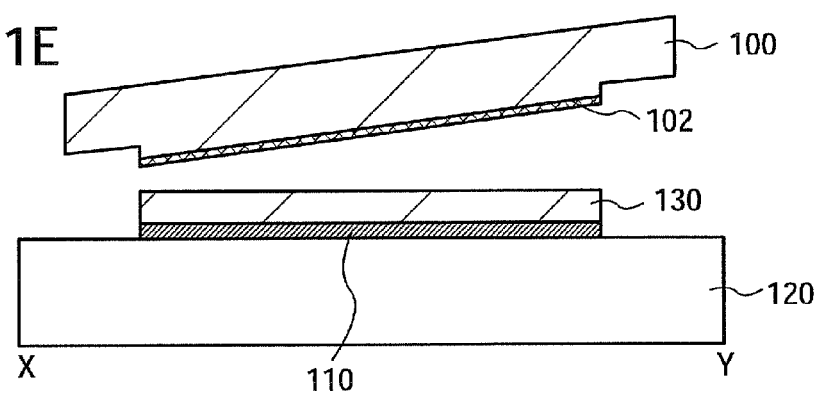
Figure 2E:
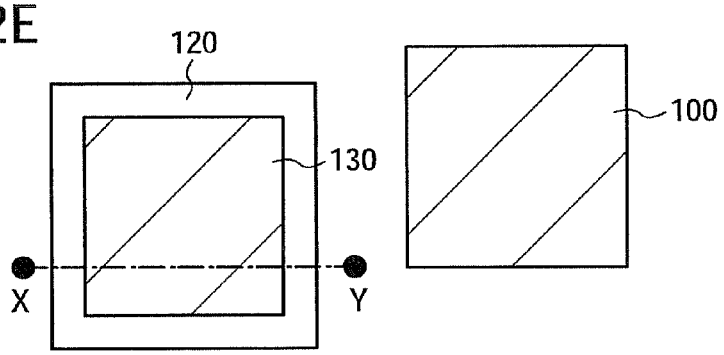
Figure 3E:
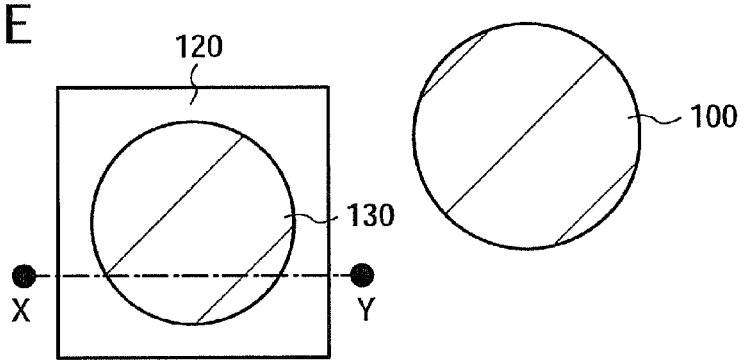

Next, heat treatment is performed to separate the semiconductor substrate 100 while a thin semiconductor layer 130 is left remaining over the supporting substrate 120 (see FIGS. 1E, 2E, and 3E). The heat treatment is preferably performed at a temperature equal to or higher than the temperature at which the bonding layer 110 is formed and equal to or lower than the upper temperature limit of the supporting substrate 120, preferably at equal to or higher than 400° C. to lower than 700° C. Through the heat treatment performed within this temperature range, a change occurs in the volume of the microvoids formed in the embrittled layer 102, which allows the semiconductor substrate 100 to start to cleave and to be separated along the embrittled layer 102. Because the bonding layer 110 is bonded to the supporting substrate 120, the semiconductor layer 130 having the same crystallinity as that of the semiconductor substrate 100 is left remaining over the supporting substrate 120 in this mode. Note that it is preferable that a single-crystal semiconductor substrate be used as the semiconductor substrate 100 and a single-crystal semiconductor layer be formed as the semiconductor layer 130.

In this mode, a region of the semiconductor substrate 100 in a projecting shape other than the etched outer edge is bonded to the supporting substrate 120. Therefore, the semiconductor layer 130 which is left remaining has roughly the same shape as that of the region of the semiconductor substrate 100 other than the outer edge.

Note that the surface of the semiconductor layer 130 which is transferred to the supporting substrate 120 is preferably planarized. For example, the planarization can be performed by chemical mechanical polishing (CMP). Instead of a CMP process, the planarization may be performed by irradiation of the surface of the semiconductor layer 130 with a laser beam or by heat treatment performed using an electrically heated oven, a lamp annealing furnace, a rapid thermal annealing (RTA) apparatus, or the like. The irradiation with a laser beam is preferably performed in a nitrogen atmosphere with an oxygen concentration of 10 ppm or less. This is because, when the irradiation with a laser beam is performed in an oxygen atmosphere, the surface of the semiconductor layer may be roughened. By irradiation of the semiconductor layer with a laser beam or by heat treatment, it is also possible to recover the crystallinity, defect, damage, or the like of the semiconductor layer. By irradiation with a laser beam or by heat treatment after a CMP process is performed, it is also possible to recover a damaged layer on the surface due to the CMP process. In addition, CMP or the like may be performed for the purpose of thinning of the semiconductor layer obtained.

Through the above steps, an SOI substrate, in which the semiconductor layer 130 is provided over the supporting substrate 120 with the bonding layer 110 interposed therebetween, can be manufactured.

Note that, although an example in which the bonding layer 110 is formed on the semiconductor substrate 100 after the embrittled layer 102 is formed in the semiconductor substrate 100 is given in this mode, the present invention is not particularly limited thereto. The supporting substrate 120 and the semiconductor substrate 100 may be superposed on each other and bonded to each other with the bonding layer 110 interposed therebetween. For example, it is also possible that, after the bonding layer 110 is formed on the semiconductor substrate 100, the embrittled layer 102 is formed by irradiation of the semiconductor substrate 100 with ions.

In addition, although an example in which the supporting substrate 120 has a larger area than the semiconductor substrate 100 is given in this mode, the present invention is not particularly limited thereto. The supporting substrate 120 may have about the same area as the semiconductor substrate 100 or may have a different shape from the semiconductor substrate 100.

One feature of the method for manufacturing an SOI substrate of this mode is to bond a semiconductor substrate to a supporting substrate after the outer edge of the semiconductor substrate is selectively etched in advance. Therefore, defective bonding resulting from the outer edge of the semiconductor substrate can be prevented, and yield in manufacturing an SOI substrate can be increased.

In this mode, when a single-crystal silicon substrate is used as the semiconductor substrate 100, a single-crystal silicon layer can be obtained as the semiconductor layer 130. In addition, because the method for manufacturing an SOI substrate of this mode allows process temperature to be 700° C. or lower, a glass substrate can be used as the supporting substrate 120. In other words, in a similar manner to a conventional thin film transistor using polycrystalline silicon, a transistor using single-crystal silicon can be formed over a glass substrate, and a single-crystal silicon layer can be used as an active layer. Therefore, the characteristics of a semiconductor element such as a transistor can be improved drastically.

Note that, when a semiconductor substrate is irradiated with ions to form an embrittled layer, there is a problem in that a conventional ion doping apparatus or ion implantation apparatus cannot suitably irradiate the entire surface of the semiconductor substrate with ions. For example, when a substrate is set in a chamber, a part of the outer edge of the substrate is fixed by a fixing jig such as a clamp. When the semiconductor substrate is irradiated with ions, there are cases where the fixing jig serves as a mask and a region of the semiconductor substrate which overlaps with the fixing jig is not irradiated with ions. That is, there is a region in which no embrittled layer is formed partly or entirely in the outer edge of the semiconductor substrate. As a result, when the semiconductor substrate is separated at an embrittled layer after bonding, the semiconductor substrate is left remaining or a semiconductor layer is lost or cracked in some cases. Hereinafter, this is specifically described with reference to FIGS. 7A1 to 7B2. Note that FIGS. 7A1 and 7B1 correspond to cross-sectional views taken along chain line O-P of FIGS. 7A2 and 7B2, respectively.

For example, a semiconductor substrate 7000 is irradiated with ions 7004 with a part of its outer edge fixed by a fixing jig 7006 to form an embrittled layer 7002 (see FIGS. 7A1 and 7A2). The fixing jig 7006 serves as a mask, and the embrittled layer 7002 is not formed in the part of the outer edge of the semiconductor substrate 7000. The semiconductor substrate 7000 is bonded to a supporting substrate 7020 with an insulating layer 7008 interposed therebetween. Then, heat treatment is performed to separate the semiconductor substrate 7000 along the embrittled layer 7002. Over the supporting substrate 7020, a semiconductor layer 7030 having the same crystallinity as that of the semiconductor substrate 7000 is left remaining with the insulating layer 7008 interposed therebetween (see FIGS. 7B1 and 7B2). Here, in a region of the semiconductor substrate 7000 which is fixed by the fixing jig 7006, the embrittled layer 7002 is not formed. Therefore, in the region where the embrittled layer 7002 is not formed, at the time of separation of the semiconductor substrate 7000 by the heat treatment, there may occur defective separation like partial remaining of the semiconductor substrate 7000 over the supporting substrate 7020, or in contrast, loss or crack in the semiconductor layer 7030. In this manner, defective bonding may occur resulting from the outer edge of the semiconductor substrate, regardless of whether or not the outer edge of the semiconductor substrate warps or bends.

However, by selective etching of the outer edge of the semiconductor substrate using the method for manufacturing an SOI substrate of this mode, the region where the embrittled layer is not formed can be removed. Therefore, it is possible to prevent defective bonding such as partial remaining of the semiconductor substrate over the supporting substrate or loss in the semiconductor layer. In addition, by selective etching of the outer edge of the semiconductor substrate after the embrittled layer is formed in the semiconductor substrate, the region where the embrittled layer is not formed can surely be etched. Note that, when the problem of the fixing jig during ion irradiation is particularly serious as a problem resulting from the outer edge of the semiconductor substrate, the effect of the present invention can be sufficiently obtained by selective etching of only a region of the outer edge of the semiconductor substrate which overlaps with the fixing jig. Here, an example of another mode of an SOI substrate of this mode is described with reference to FIGS. 18A to 18E.

A semiconductor substrate 100 is prepared. The semiconductor substrate 100 is set in a chamber of an ion doping apparatus or an ion implantation apparatus. Here, four sides of the semiconductor substrate 100 are fixed by a fixing jig 182. Then, the semiconductor substrate 100 is irradiated with ions to form an embrittled layer in the semiconductor substrate 100 at a predetermined depth (see FIG. 18A). Here, the fixing jig 182 which fixes the semiconductor substrate 100 functions as a mask during ion irradiation. Therefore, the embrittled layer is not formed in the semiconductor substrate 100 under the fixing jig 182.

Figure 18A:
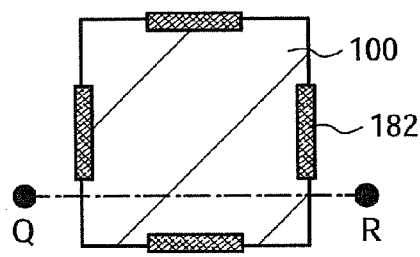
FIGS. 18A to 18E are diagrams showing an example of a method for manufacturing an SOI substrate.
Figure 18B:
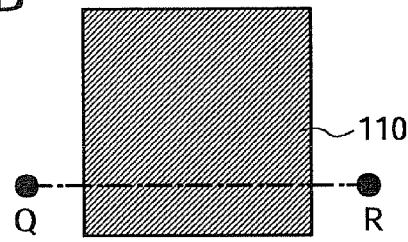

A bonding layer 110 is formed on the semiconductor substrate 100 (see FIG. 18B). Note that the bonding layer 110 may be formed before the semiconductor substrate 100 is irradiated with ions. In addition, between the semiconductor substrate 100 and the bonding layer 110, an insulating layer which functions as a blocking layer, such as a silicon nitride layer, a silicon nitride oxide layer, or a silicon oxynitride layer, may be formed.

Figure 18C:
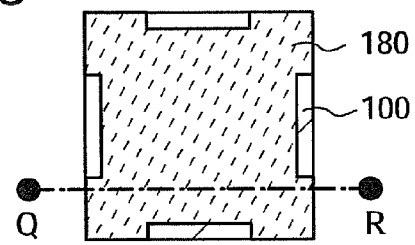
Figure 18D:
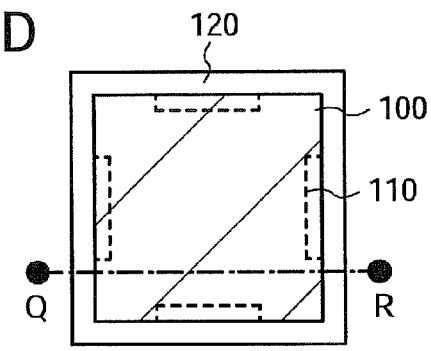
Figure 18E:
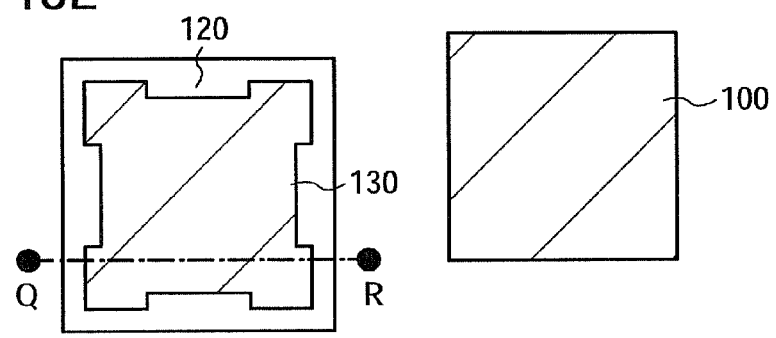

A region of the semiconductor substrate 100 where the embrittled layer is not formed and its vicinity are selectively etched (see FIG. 18C). For example, a mask layer 180 is formed to expose a region of the semiconductor substrate 100 which overlaps with the fixing jig 182 when the semiconductor substrate 100 is irradiated with ions and its vicinity. With the use of the mask layer 180, the semiconductor substrate 100 is etched on the side where the semiconductor substrate 100 is to form a bond with a supporting substrate to a region at a greater depth than the embrittled layer. Note that the etching is performed here so that the semiconductor substrate 100 is not penetrated. After the etching of the semiconductor substrate 100, the mask layer 180 is removed.

A supporting substrate 120 and the semiconductor substrate 100 are superposed on each other and bonded to each other with the bonding layer 110 interposed therebetween. In this mode, a bond is formed by making the supporting substrate 120 and the surface of the semiconductor substrate 100 on which the bonding layer 110 is formed face each other and be in contact with each other (see FIG. 18D).

Note that an insulating layer which serves as a bonding layer may also be provided on the supporting substrate 120 side. In that case, between the supporting substrate 120 and the bonding layer, an insulating layer which functions as a blocking layer, such as a silicon nitride layer, a silicon nitride oxide layer, or a silicon oxynitride layer, is preferably formed.

Heat treatment is performed to separate the semiconductor substrate 100 so that a thin semiconductor layer 130 is left remaining over the supporting substrate 120. The heat treatment is preferably performed at a temperature equal to or higher than the temperature at which the bonding layer is formed and equal to or lower than the upper temperature limit of the supporting substrate 120. Specifically, the heat treatment is preferably performed at equal to or higher than 400° C. to lower than 700° C. The heat treatment enables the embrittled layer formed in the semiconductor substrate 100 to start to cleave and to be separated. Because the bonding layer 110 is bonded to the supporting substrate, the semiconductor layer 130 having the same crystallinity as that of the semiconductor substrate 100 is left remaining over the supporting substrate 120 (see FIG. 18E).

In this mode, after the embrittled layer is formed in the semiconductor substrate 100, the region of the semiconductor substrate 100 where the embrittled layer is not formed and its vicinity are selectively etched. Specifically, the region of the semiconductor substrate 100 which overlaps with the fixing jig 182 and its vicinity are etched. Therefore, the supporting substrate 120 and the semiconductor substrate 100 form a bond in a region other than the etched region of the semiconductor substrate 100 is etched, that is, in a region where the semiconductor substrate 100 does not overlap with the fixing jig 182. Note that it is difficult to precisely etch only the region where the semiconductor substrate 100 and the fixing jig 182 overlap with each other; therefore, some misalignment is considered acceptable. The semiconductor layer 130 which is transferred onto the supporting substrate 120 is preferably subjected to a CMP process in order to planarize its surface. Alternatively, the planarization may be performed by irradiation of the surface of the semiconductor layer 130 with a laser beam or by heat treatment performed using an electrically heated oven, a lamp annealing furnace, a rapid thermal annealing (RTA) apparatus, or the like. The irradiation with a laser beam is preferably performed in a nitrogen atmosphere with an oxygen concentration of 10 ppm or less. This is because, when the irradiation with a laser beam is performed in an oxygen atmosphere, the surface of the semiconductor layer may be roughened. By irradiation of the semiconductor layer with a laser beam or by heat treatment, it is also possible to recover the crystallinity, defect, damage, or the like of the semiconductor layer. By irradiation with a laser beam or by heat treatment after a CMP process is performed, it is also possible to recover a damaged layer on the surface due to the CMP process. In addition, CMP or the like may be performed for the purpose of thinning of the semiconductor layer obtained.

Through the above steps, an SOI substrate, in which the semiconductor layer 130 is provided over the supporting substrate 120 with the bonding layer interposed therebetween, can be manufactured.

One feature of the method for manufacturing an SOI substrate of this mode is to selectively etch a part of the outer edge or the entire outer edge of the semiconductor substrate before bonding the semiconductor substrate and the supporting substrate together. There is no particular limitation on the structure of an SOI substrate.

Figure 4A:
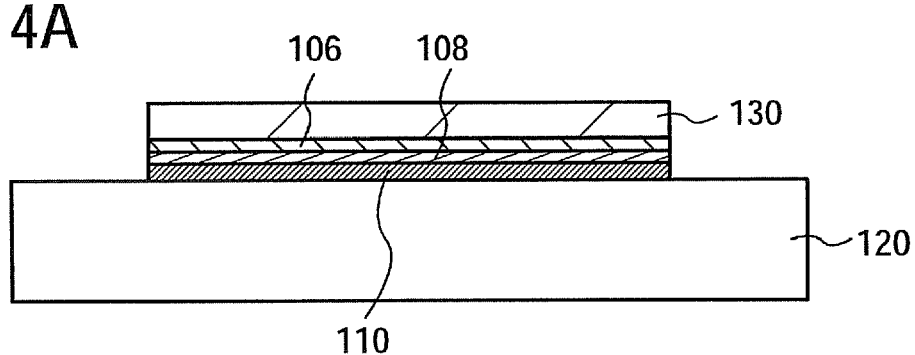
FIGS. 4A to 4C are diagrams each showing an example of a structure of an SOI substrate.

FIG. 4A shows an example in which an insulating layer which functions as a blocking layer is formed between the semiconductor layer 130 and the bonding layer 110. As the blocking layer, a single-layer structure of a single layer or a stacked-layer structure of a plurality of layers selected from a silicon nitride layer, a silicon nitride oxide layer, and a silicon oxynitride layer can be provided. Note that a silicon nitride oxide layer in this specification means a layer that contains more nitrogen than oxygen and, in the case where measurements are performed using Rutherford backscattering spectrometry (RBS) and hydrogen forward scattering (HFS), includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Further, a silicon oxynitride layer means a layer that contains more oxygen than nitrogen and, in the case where measurements are perfonlied using RBS and HFS, includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Note that percentages of nitrogen, oxygen, silicon, and hydrogen fall within the ranges given above, where the total number of atoms contained in the silicon nitride oxide layer or the silicon oxynitride layer is defined as 100 at. %.

Here, FIG. 4A shows, as an example, a structure in which a silicon oxynitride layer 106 and a silicon nitride oxide layer 108 are provided from the semiconductor layer 130 side. The silicon nitride oxide layer 108 is effective in preventing an impurity from diffusing into the semiconductor layer 130 side. The silicon oxynitride layer 106 acts to relieve internal stress of the silicon nitride oxide layer 108. If such a combined blocking layer (in FIG. 4A, the stacked-layer structure of the silicon oxynitride layer 106 and the silicon nitride oxide layer 108) is provided, the contamination of the semiconductor layer 130 by an impurity can be prevented and stress distortion can be relieved.

When an SOI substrate having the structure shown in FIG. 4A is manufactured, after the stacked-layer structure of the silicon oxynitride layer 106 and the silicon nitride oxide layer 108 is formed over a semiconductor substrate, the semiconductor substrate is irradiated with ions from the side where the silicon nitride oxide layer 108 is formed, whereby an embrittled layer is formed. Because the semiconductor substrate is irradiated with ions through the silicon oxynitride layer 106 and the silicon nitride oxide layer 108, the surface of the semiconductor substrate can be prevented from being roughened by ion irradiation. A bonding layer 110 is formed over the silicon nitride oxide layer 108, and the outer edge of the semiconductor substrate is selectively etched on the bonding layer 110 side to a region at a greater depth than the embrittled layer. The silicon oxynitride layer 106 and the silicon nitride oxide layer 108 over the outer edge of the semiconductor substrate are also selectively etched. After the semiconductor substrate is bonded to a supporting substrate 120 with the bonding layer 110 interposed therebetween, the semiconductor substrate is separated by heat treatment. The semiconductor substrate is separated at the embrittled layer. Therefore, a semiconductor layer 130 is left remaining over the supporting substrate 120 with the bonding layer 110, the silicon nitride oxide layer 108, and the silicon oxynitride layer 106 interposed therebetween. Because the outer edge of the semiconductor substrate is selectively etched before bonding to the supporting substrate 120, defective bonding can be prevented and an SOI substrate can be manufactured with high yield. Note that, when the influence of the fixing jig which fixes the outer edge of the semiconductor substrate during ion irradiation becomes a problem, a structure in which only a region which overlaps with the fixing jig and in which the embrittled layer is not formed is selectively etched is also possible. The silicon oxynitride layer 106 and the silicon nitride oxide layer 108, which are formed between the semiconductor substrate and the bonding layer 110, may be formed after the embrittled layer is formed in the semiconductor substrate. Alternatively, after the silicon oxynitride layer 106, the silicon nitride oxide layer 108, and the bonding layer 110 are formed over the semiconductor substrate, the embrittled layer may be formed in the semiconductor substrate.

Figure 4B:
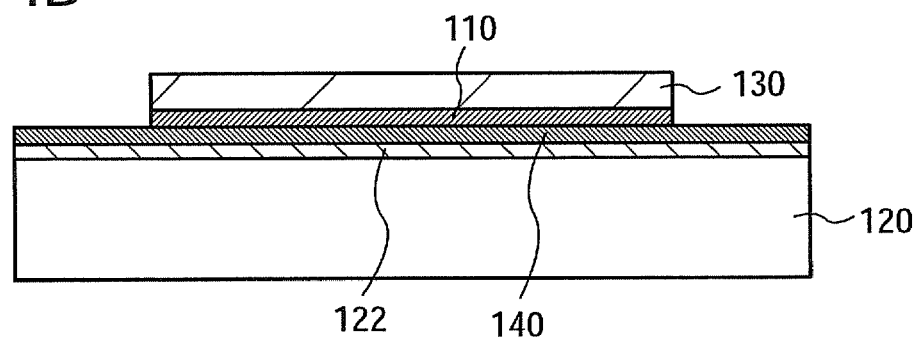

FIG. 4B shows an example in which an insulating layer which functions as a blocking layer and an insulating layer which functions as a bonding layer are formed on the supporting substrate side. As the blocking layer, in a similar manner to FIG. 4A, a single-layer structure of a single layer or a stacked-layer structure of a plurality of layers selected from a silicon nitride layer, a silicon nitride oxide layer, and a silicon oxynitride layer may be provided. As a bonding layer 140, an insulating layer similar to the bonding layer 110, which has a smooth surface and can form a hydrophilic surface, is formed. For example, a silicon oxide layer formed by a chemical vapor deposition method using silane such as organic silane like TEOS or monosilane as a source gas, an insulating layer having siloxane bonds, or the like can be used.

FIG. 4B shows, as an example, a structure in which a silicon nitride layer 122 and the bonding layer 140 are formed on the supporting substrate 120 side. When a glass substrate used in the electronics industry such as an aluminosilicate glass substrate, an aluminoborosilicate glass substrate, a barium borosilicate glass substrate is used as the supporting substrate 120, the glass substrate contains a slight amount of alkali metal such as sodium, and this slight amount of impurity may adversely affect the characteristics of a semiconductor element such as a transistor. The silicon nitride layer 122 is effective in preventing an impurity contained in the supporting substrate 120 as described above from diffusing into the semiconductor layer 130 side. Note that, instead of the silicon nitride layer 122, a silicon nitride oxide layer may be formed. By provision of a stacked-layer structure of a silicon nitride oxide layer and a silicon oxynitride layer, the diffusion of an impurity into a semiconductor layer can be prevented and stress distortion can be relieved. By provision of the bonding layer 140 on the supporting substrate 120 side, bonding strength between the semiconductor layer 130 and the supporting substrate 120 can be increased.

When an SOI substrate having the structure shown in FIG. 4B is manufactured, after a semiconductor substrate is irradiated with ions to form an embrittled layer, the bonding layer 110 is formed over the semiconductor substrate, and the outer edge of the semiconductor substrate is selectively etched on the bonding layer 110 side to a region at a greater depth than the embrittled layer. The bonding layer 110 over the semiconductor substrate is also selectively etched. After the silicon nitride layer 122 is formed over the supporting substrate 120, the bonding layer 140 is formed over the silicon nitride layer 122. After the bonding layer 140 formed over the supporting substrate 120 and the bonding layer 110 formed over the semiconductor substrate are bonded together, the semiconductor substrate is separated by heat treatment. The semiconductor substrate 100 starts to cleave and is separated at the embrittled layer. Therefore, the semiconductor layer 130 is left remaining over the supporting substrate 120 with the silicon nitride layer 122, the bonding layer 140, and the bonding layer 110 interposed therebetween. Because the outer edge of the semiconductor substrate is selectively etched before bonding to the supporting substrate as described above, defective bonding can be prevented and an SOI substrate can be manufactured with high yield. Note that, when the influence of a fixing jig which fixes the outer edge of the semiconductor substrate during ion irradiation becomes a problem, a structure in which only a region which overlaps with the fixing jig and in which the embrittled layer is not formed is selectively etched is also possible. Alternatively, after the bonding layer 110 is formed over the semiconductor substrate, the embrittled layer may be formed in the semiconductor substrate.

Figure 4C:
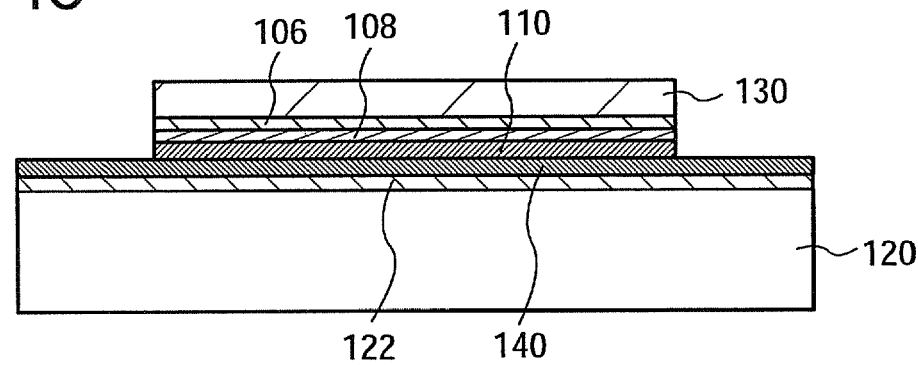

Note that, in the structure shown in FIG. 4B, an insulating layer which functions as a blocking layer can also be formed between the semiconductor layer 130 and the bonding layer 110. For example, as shown in FIG. 4C, the silicon oxynitride layer 106 and the silicon nitride oxide layer 108 may be formed from the semiconductor layer 130 side. In this case, the embrittled layer may be formed in the semiconductor substrate after an insulating layer which functions as a blocking layer is formed over the semiconductor substrate. Alternatively, the embrittled layer may be formed in the semiconductor substrate after the insulating layer which functions as a blocking layer and the bonding layer 110 are formed over the semiconductor substrate. Furthermore, after the embrittled layer is formed in the semiconductor substrate, the insulating layer which functions as a blocking layer and the insulating layer which functions as a bonding layer may be formed over the semiconductor substrate.

Here, an example of a method for manufacturing an SOI substrate in which an insulating layer which functions as a bonding layer is provided on the supporting substrate side is specifically described with reference to FIGS. 5A to 5E. In addition, an example in which a bonding layer provided on the semiconductor substrate side is formed by a thermal oxidation method is described.

Figure 5A:
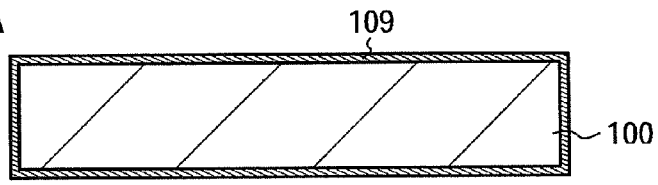
FIGS. 5A to 5E are diagrams showing an example of a method for manufacturing an SOI substrate.
Figure 5B:
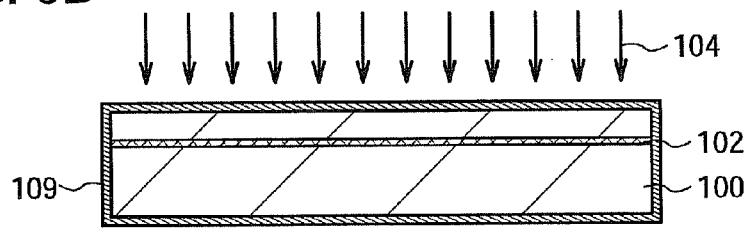
Figure 5C:
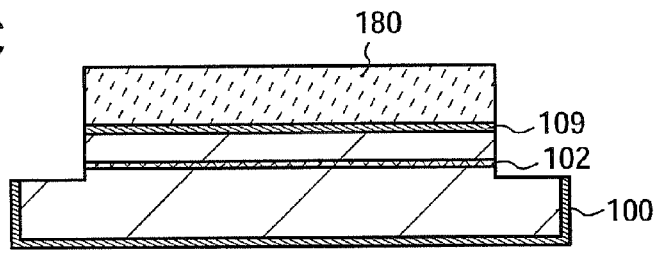

An oxide film 109 is formed on a semiconductor substrate 100 (see FIG. 5A). The oxide film 109 is preferably formed by thermal oxidation of the semiconductor substrate 100 in an oxidizing atmosphere. When thermal oxidation is performed, thermal oxidation may be performed in an atmosphere containing HCl in addition to oxygen. When a single-crystal silicon substrate is used as the semiconductor substrate 100, a silicon oxide layer can be formed as the oxide film 109.

Next, the semiconductor substrate 100 is irradiated with ions 104, which are accelerated by an electric field, to form an embrittled layer 102 in a region of the semiconductor substrate 100 at a predetermined depth. The oxide film 109 is irradiated with the ions 104, which are transmitted through the oxide film 109 and implanted into the semiconductor substrate 100 (see FIG. 5B).

Next, the outer edge of the semiconductor substrate 100 is selectively etched. Here, after a mask layer 180 is formed so that the outer edge of the semiconductor substrate 100 is exposed, with the use of the mask layer 180, the semiconductor substrate 100 is etched on the side where the semiconductor substrate 100 is to form a bond with a supporting substrate to a region at a greater depth than the embrittled layer 102. The oxide film 109 over the outer edge of the semiconductor substrate 100 is also etched (see FIG. 5C). After the etching, the mask layer 180 is removed.

Figure 5D:
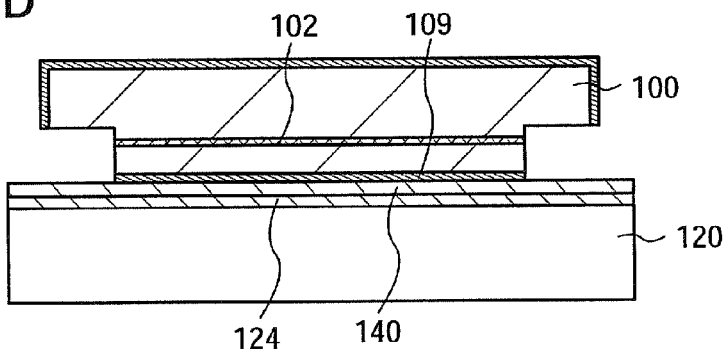
Figure 5E:
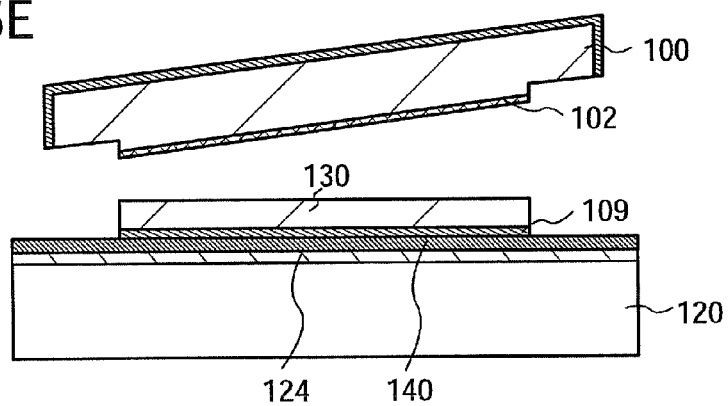

Next, a supporting substrate 120 and the semiconductor substrate 100 are bonded together (see FIG. 5D). Here, a blocking layer 124 and a bonding layer 140 are formed over the supporting substrate 120. As the blocking layer 124, a single-layer structure of a single layer or a stacked-layer structure of a plurality of layers selected from a silicon nitride layer, a silicon nitride oxide layer, and a silicon oxynitride layer can be provided. By provision of a nitrogen-containing insulating layer as the blocking layer 124, it is possible to prevent a metal impurity contained in the supporting substrate 120 from diffusing into the semiconductor layer (semiconductor substrate 100) side.

As the bonding layer 140, a layer which has a smooth surface and has a hydrophilic surface is formed. As the bonding layer 140 described above, an insulating layer formed by a chemical reaction is preferably used. The bonding layer 140 which has a smooth surface and forms a hydrophilic surface is preferably provided at a thickness of 0.2 nm to 500 nm. With the bonding layer 140 formed at a thickness within the above range, it is possible to smooth surface roughness of a surface on which a film is to be formed and also to ensure smoothness of the growing surface of the film. For the bonding layer 140, a silicon oxide layer is suitable, and in particular, a silicon oxide layer formed by a chemical vapor deposition method using organic silane as a source gas is preferable.

The supporting substrate 120 provided with the blocking layer 124 and the bonding layer 140 and the semiconductor substrate 100 provided with the oxide film 109 are located in contact with each other to form a bond. In this case, the oxide film 109 and the bonding layer 140 form a bond. Note that a surface which is to form a bond is sufficiently cleaned. A strong bond due to hydrogen bonding can be formed by pressure bonding of the supporting substrate 120 and the semiconductor substrate 100. Note that, in order to form a favorable bond between the supporting substrate 120 and the semiconductor substrate 100, one or both of the bonding surfaces of the oxide film 109 and the bonding layer 140 may be activated. Heat treatment or pressure treatment performed after bonding the supporting substrate 120 and the semiconductor substrate 100 makes it possible to increase bonding strength.

In this mode, the outer edge of the semiconductor substrate 100 is selectively etched, and a region remaining in a projecting shape other than the etched outer edge forms a bond with the supporting substrate 120. In this mode, the outer edge of the semiconductor substrate which is likely to warp is selectively etched in advance, and a region of the semiconductor substrate other than the outer edge is bonded to the supporting substrate. Therefore, it is easy to ensure sufficient bonding strength between the supporting substrate and the semiconductor substrate. In addition, because the bonding layer 140 and the oxide film 109 which functions as a bonding layer are bonded together, bonding strength can be increased.

Next, heat treatment is performed to separate the semiconductor substrate 100 while a thin semiconductor layer 130 is left remaining over the supporting substrate 120. The heat treatment is preferably performed at a temperature equal to or higher than the temperature at which the bonding layer 140 is formed and equal to or lower than the upper temperature limit of the supporting substrate 120, preferably, at equal to or higher than 400° C. to lower than 700° C. Through the heat treatment performed within this temperature range, a change occurs in the volume of microvoids formed in the embrittled layer 102, which allows the semiconductor substrate 100 to be separated along the embrittled layer 102. Because the oxide film 109 is bonded to the supporting substrate 120 with the bonding layer 140 and the blocking layer 124 interposed therebetween, the semiconductor layer 130 having the same crystallinity as that of the semiconductor substrate 100 is left remaining over the supporting substrate 120 in this mode (see FIG. 5E).

Note that, in this mode, a region of the semiconductor substrate 100 having a projecting shape other than the etched outer edge is bonded to the supporting substrate 120. Therefore, the semiconductor layer 130 which is left remaining has roughly the same shape as that of the region of the semiconductor substrate 100 other than the outer edge. The semiconductor layer 130 which is transferred onto the supporting substrate 120 is preferably subjected to a CMP process in order to planarize its surface. Alternatively, the planarization may be performed by irradiation of the surface of the semiconductor layer 130 with a laser beam or by heat treatment performed using an electrically heated oven, a lamp annealing furnace, an RTA apparatus, or the like. The irradiation with a laser beam is preferably performed in a nitrogen atmosphere with an oxygen concentration of 10 ppm or less. This is because, when the irradiation with a laser beam is performed in an oxygen atmosphere, the surface of the semiconductor layer may be roughened. By irradiation of the semiconductor layer or by heat treatment, it is also possible to recover the crystallinity, defect, damage, or the like of the semiconductor layer. By irradiation with a laser beam or by heat treatment after a CMP process is performed, it is also possible to recover a damaged layer on the surface due to the CMP process. In addition, CMP or the like may be performed for the purpose of thinning of the semiconductor layer obtained.

Through the above steps, an SOI substrate, in which the semiconductor layer 130 is provided over the supporting substrate 120 with the blocking layer 124, the bonding layer 140, and the oxide film 109 interposed therebetween, can be manufactured.

By the method for manufacturing an SOI substrate of this mode, a semiconductor substrate is bonded to a supporting substrate after the outer edge of the semiconductor substrate is selectively etched in advance. Therefore, defective bonding resulting from the outer edge of the semiconductor substrate can be prevented, and yield in manufacturing an SOI substrate can be increased. In addition, by provision of the blocking layer 124 between the supporting substrate 120 and the semiconductor layer 130, the contamination of the semiconductor layer 130 by a metal impurity or the like can be prevented. Furthermore, by provision of the bonding layer 140 also on the supporting substrate 120 side, bonding strength can be increased.

When the influence of a fixing jig which fixes a substrate during ion irradiation becomes a problem in the method for manufacturing an SOI substrate shown in FIGS. 5A to 5E, a structure where a region which overlaps with the fixing jig and in which the embrittled layer is not formed is selectively etched is also possible.

Figure 6A:
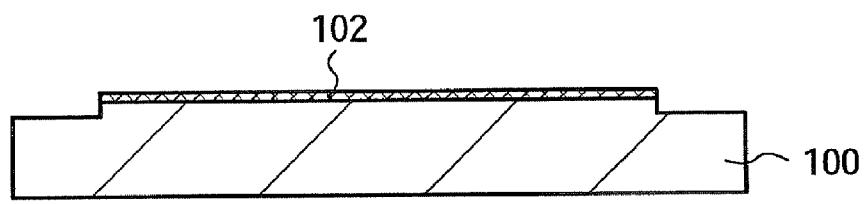
FIGS. 6A and 6B are diagrams showing an example of reuse of a semiconductor substrate.
Figure 6B:
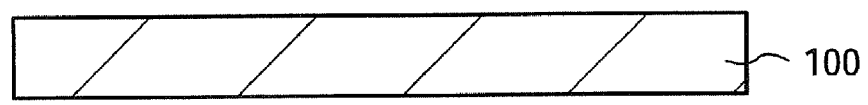

After the SOI substrate of this mode is manufactured, the semiconductor substrate 100 after separation can be reused. FIG. 6A shows the semiconductor substrate 100 which is separated at the embrittled layer 102 in manufacturing a desired SOI substrate. The semiconductor substrate 100 can be reused after the separation surface at which the semiconductor substrate 100 is separated from the semiconductor layer 130 (the embrittled layer 102 serving as a cleavage surface) is planarized. The planarization of the separation surface of the semiconductor substrate 100 is preferably performed by polishing, particularly, mirror polishing. After being planarized as shown in FIG. 6B, the semiconductor substrate 100 can be used again as a semiconductor substrate for manufacturing an SOI substrate.

In this mode, the outer edge of the semiconductor substrate to be bonded to the supporting substrate in manufacturing an SOI substrate is selectively etched in advance to a region at a greater depth than the embrittled layer 102. Thus, defective bonding such as loss or defective separation resulting from the outer edge of the semiconductor substrate can be prevented; therefore, a defect such as loss or crack in a semiconductor layer to be separated can also be prevented. Accordingly, the need to process the semiconductor substrate for reuse can be eliminated. In addition, because the semiconductor substrate after separation can be reused to manufacture another SOI substrate, a significant reduction in cost can also be achieved.

If the embrittled layer is partially not formed due to the influence of a fixing jig which fixes a semiconductor substrate during irradiation of the substrate with ions, there are cases where the outer edge of the semiconductor substrate after separation has a projecting shape. For example, there are cases where a whole region of the semiconductor substrate where the embrittled layer is not formed is separated without being separated at the embrittled layer. If the outer edge of the separated semiconductor substrate is left remaining in a projecting shape, it is necessary to planarize the region having a projecting shape once and then planarize the embrittled layer serving as a separation surface, which is troublesome. However, by selectively etching in advance the outer edge of a substrate before bonding so that a region where the embrittled layer is not formed is not bonded to the supporting substrate, the processing of the semiconductor substrate for reuse after the semiconductor layer is transferred to the supporting substrate becomes easier.

Figure 8A:
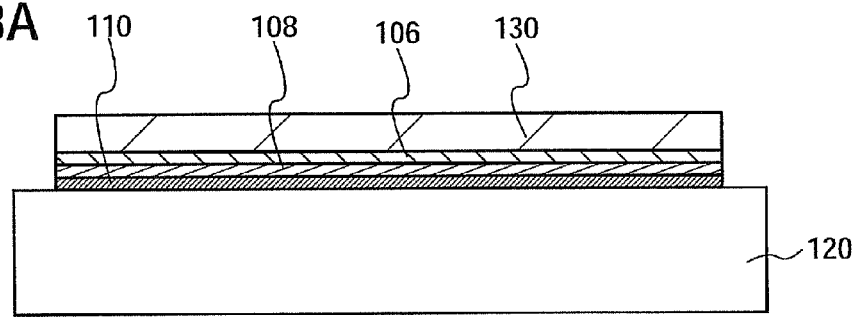
FIGS. 8A to 8D are diagrams showing an example of a method for manufacturing a semiconductor device using an SOI substrate.

Next, an example of a semiconductor device using the SOI substrate of this mode is described with reference to FIGS. 8A to 9B. In FIG. 8A, the semiconductor layer 130, which is provided with the silicon oxynitride layer 106 and the silicon nitride oxide layer 108 and further provided with the bonding layer 110, is bonded to the supporting substrate 120. The silicon nitride oxide layer 108 may be provided on the supporting substrate 120 side. By provision of the silicon nitride oxide layer 108, the contamination of the semiconductor layer 130 due to the diffusion of an impurity such as sodium or potassium can be prevented. The silicon nitride oxide layer 108 may be replaced by a silicon nitride layer, an aluminum nitride layer, or an aluminum nitride oxide layer. Note that, although an example of using the SOI substrate having the structure shown in FIG. 4A is given here, the SOI substrate having another structure described in this specification can be used.

The thickness of the semiconductor layer 130 is set to be 5 nm to 500 nm, preferably, 10 nm to 200 nm, more preferably, 10 nm to 60 nm. The thickness of the semiconductor layer 130 can be appropriately set by control of the depth of the embrittled layer 102 as shown in FIGS. 1A to 1E or 5A to 5E. In the semiconductor layer 130, a p-type impurity such as boron, aluminum, or gallium or an n-type impurity such as phosphorus or arsenic is preferably added to a formation region of an n-channel field-effect transistor or a p-channel field-effect transistor. In other words, a p-type impurity is added to a formation region of an n-channel field-effect transistor or an n-type impurity is added to a formation region of a p-channel field-effect transistor, whereby a so-called well region is formed. The dose of impurity ions may range from approximately $1\times10^{12}$ ions/cm$^2$ to $1\times10^{14}$ ions/cm$^2$. Furthermore, in the case of controlling the threshold voltage of the field-effect transistor, a p-type or n-type impurity may be added to the well region.

Figure 8B:
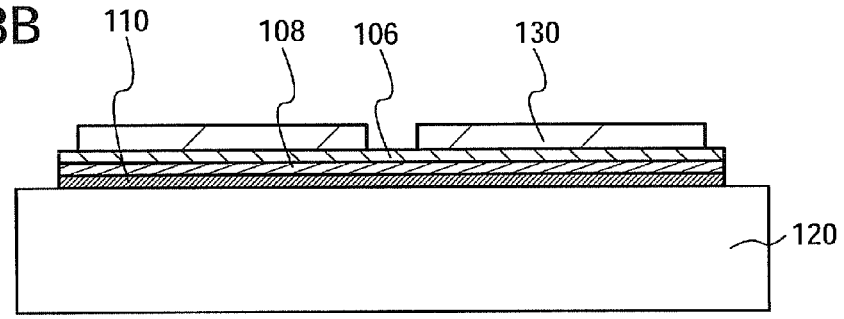
Figure 8C:
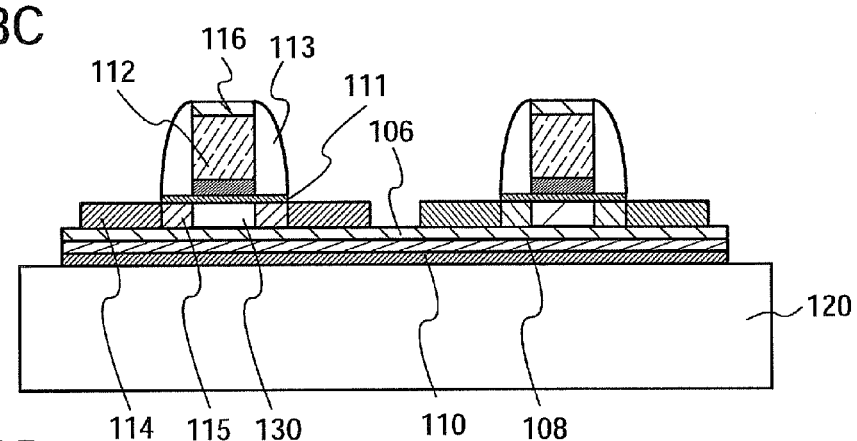

In FIG. 8B, the semiconductor layer 130 is etched to form the semiconductor layer 130 into an isolated island shape based on the arrangement of a semiconductor element. Then, as shown in FIG. 8C, a gate insulating layer 111, a gate electrode 112, and a sidewall insulating layer 113 are formed, and a first impurity region 114 and a second impurity region 115 are formed. An insulating layer 116 is formed of silicon nitride and is used as a hard mask when the gate electrode 112 is etched.

Figure 8D:
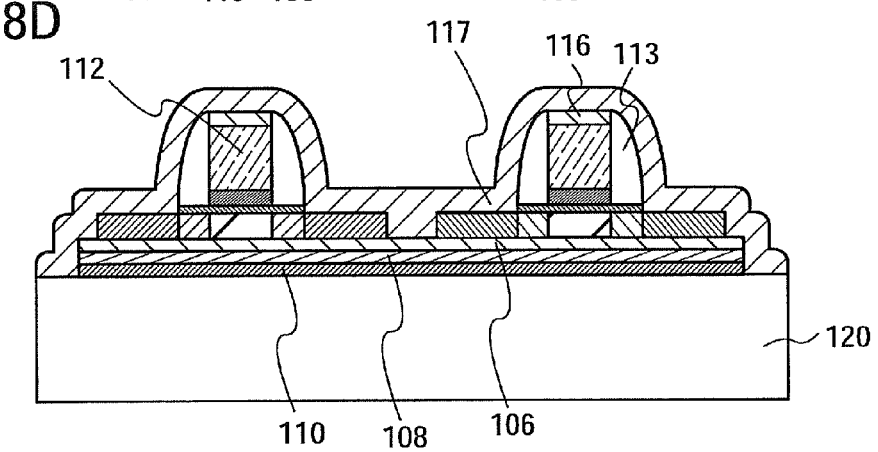

FIG. 8D shows the stage of forming a protective layer 117 after forming the gate electrode 112 and the like. As the protective layer 117, a silicon nitride layer or a silicon nitride oxide layer is preferably formed by a plasma CVD method at a substrate temperature of 350° C. or lower during film formation. By formation of the protective layer 117 in this manner, the protective layer 117 can be made to contain hydrogen. After the protective layer 117 is formed, hydrogen contained in the protective layer 117 is diffused into the semiconductor layer 130 side by heat treatment at 350° C. to 450° C. (preferably, 400° C. to 420° C.). By supply of hydrogen, which recovers defects that are generated in the previous separation step at the embrittled layer or the like during an element formation process, to the semiconductor layer 130, such defects as to serve as trapping centers can be recovered effectively. In addition, the silicon nitride oxide layer 108 prevent impurity diffusion from the supporting substrate 120 side, whereas the protective layer 117 is effective in preventing impurity contamination from the upper layer side. In this mode, an upper layer side and a lower layer side of the semiconductor layer 130 having excellent crystallinity are covered with insulating layers which are highly effective in preventing highly mobile impurity ions of sodium or the like. Therefore, a great effect in stabilizing the characteristics of a semiconductor element manufactured using the semiconductor layer 130 is obtained.

Figure 9A:
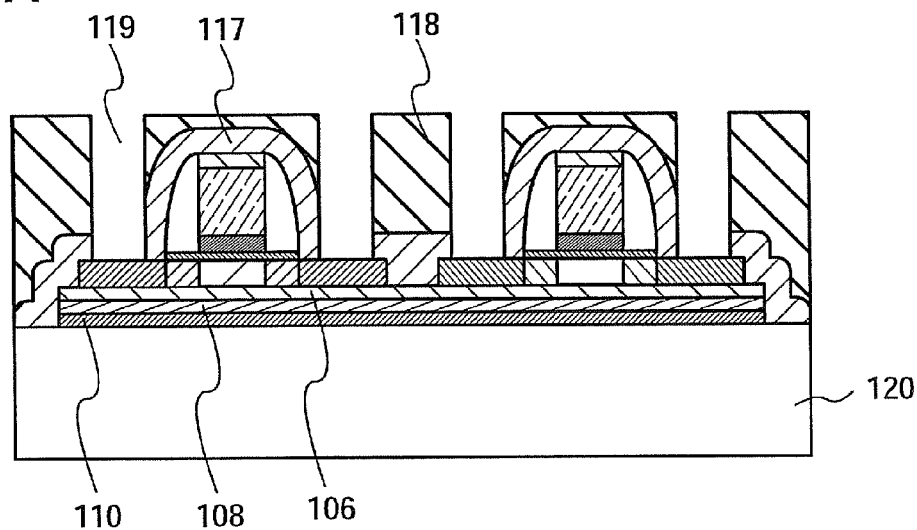
FIGS. 9A and 9B are diagrams showing an example of a method for manufacturing a semiconductor device using an SOI substrate.

After that, an interlayer insulating layer 118 is formed as shown in FIG. 9A. As the interlayer insulating layer 118, a borophosphosilicate glass (BPSG) film is formed or an organic resin typified by polyimide is formed by coating. In the interlayer insulating layer 118, a contact hole 119 is faulted.

Figure 9B:
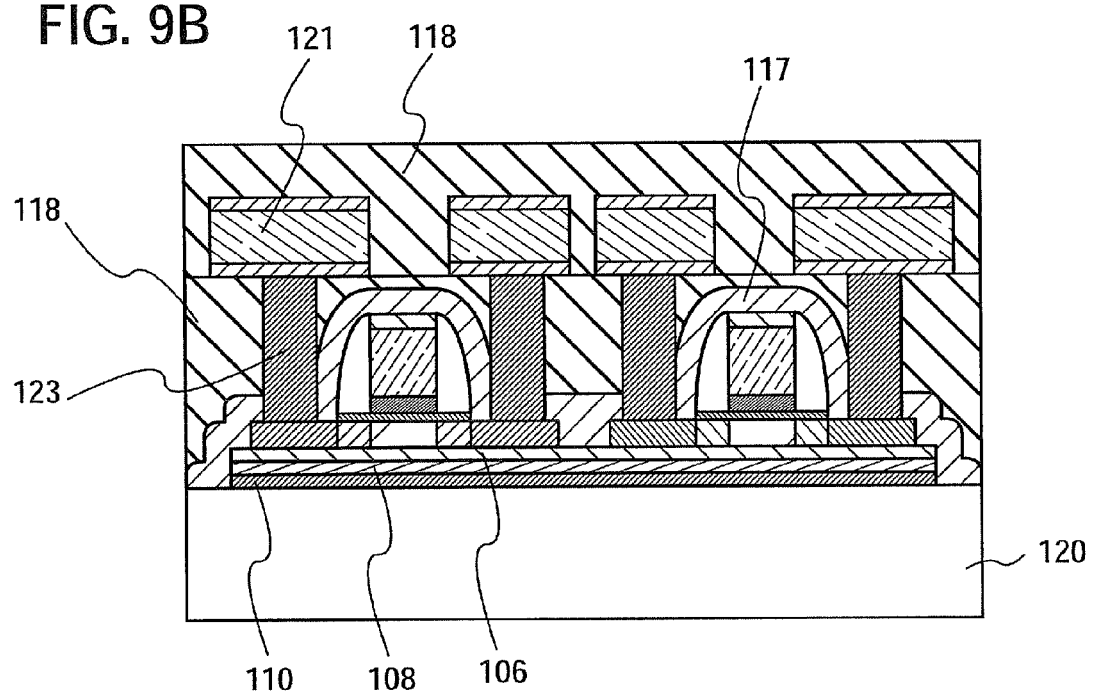

FIG. 9B shows the stage of forming a wiring. In the contact hole 119, a contact plug 123 is formed. As the contact plug 123, tungsten silicide is formed by a chemical vapor deposition method from a WF$_6$ gas and a SiH$_4$ gas to fill the contact hole 129. Alternatively, tungsten may be formed by hydrogen reduction of WF$_6$ to fill the contact hole 119. After that, a wiring 121 is formed to match the contact plug 123. The wiring 121 is formed of aluminum or an aluminum alloy, and an upper layer and a lower layer thereof are formed using metal films of molybdenum, chromium, titanium, or the like as barrier metal. Furthermore, an interlayer insulating layer 118 is formed thereover. The wiring may be provided appropriately, and a multilayer wiring may be formed by further forming a wiring layer thereover. In that case, a damascene process may be employed.

In this manner, a field-effect transistor can be manufactured using the semiconductor layer 130 that is bonded to the supporting substrate 120. In this mode, defective bonding is prevented in manufacturing an SOI substrate, and the semiconductor layer 130 transferred to the supporting substrate is unlikely to be damaged. Therefore, the semiconductor layer 130 with good characteristics can be provided. In addition, because a single-crystal semiconductor can also be used for the semiconductor layer 130, a high-performance field-effect transistor can be obtained.

Figure 10:
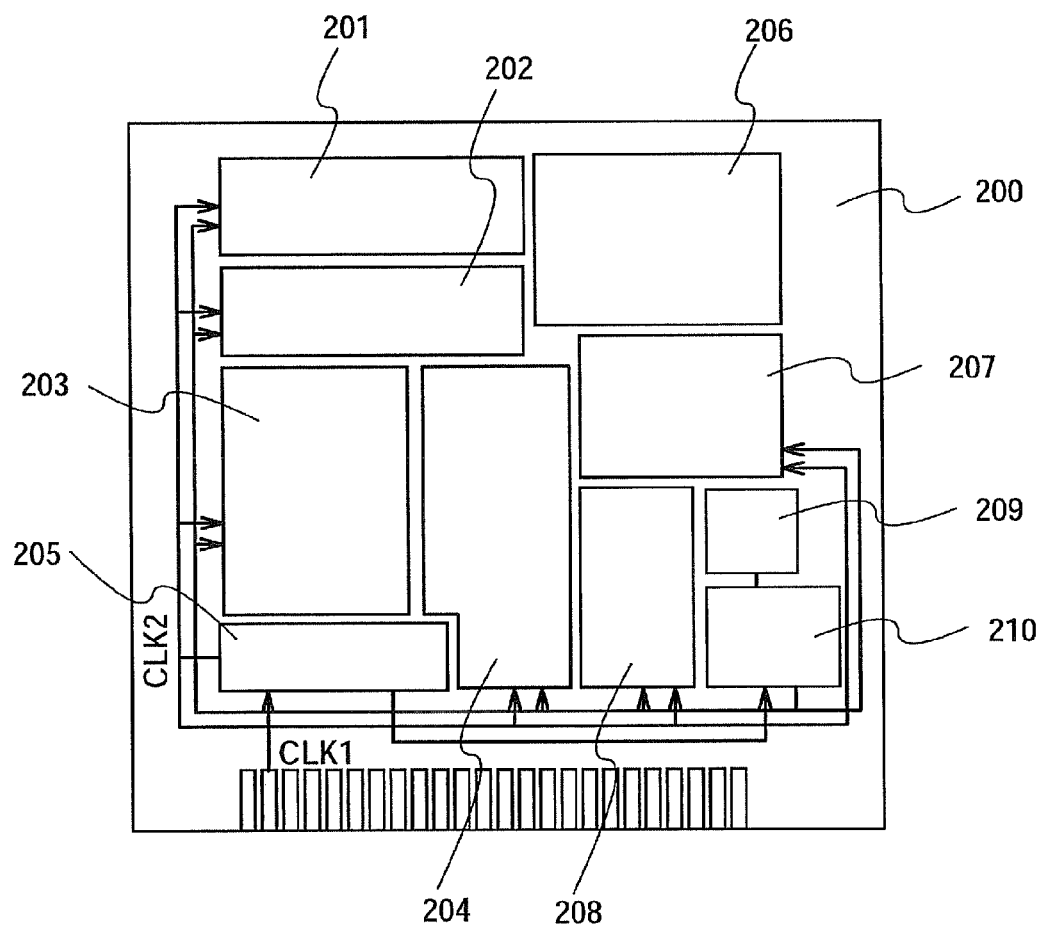
FIG. 10 is a block diagram showing a structure of a microprocessor that is obtained using an SOI substrate.

FIG. 10 shows an example of a microprocessor 200 as an example of a semiconductor device. The microprocessor 200 is manufactured using the SOI substrate of this mode. This microprocessor 200 has an arithmetic logic unit (ALU) 201, an ALU controller 202, an instruction decoder 203, an interrupt controller 204, a timing controller 205, a register 206, a register controller 207, a bus interface (Bus I/F) 208, a read-only memory 209, and a memory interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the clock signal CLK2 to the various above-mentioned circuits. Obviously, the microprocessor 200 shown in FIG. 10 is only an example in which the configuration is simplified, and an actual microprocessor may have various configurations depending on the uses.

In the microprocessor 200 as described above, by application of this mode, an integrated circuit can be formed using a single-crystal semiconductor layer that has good characteristics. Therefore, an increase in performance, an increase in speed such as operation speed, and the like can be achieved.

Figure 11:
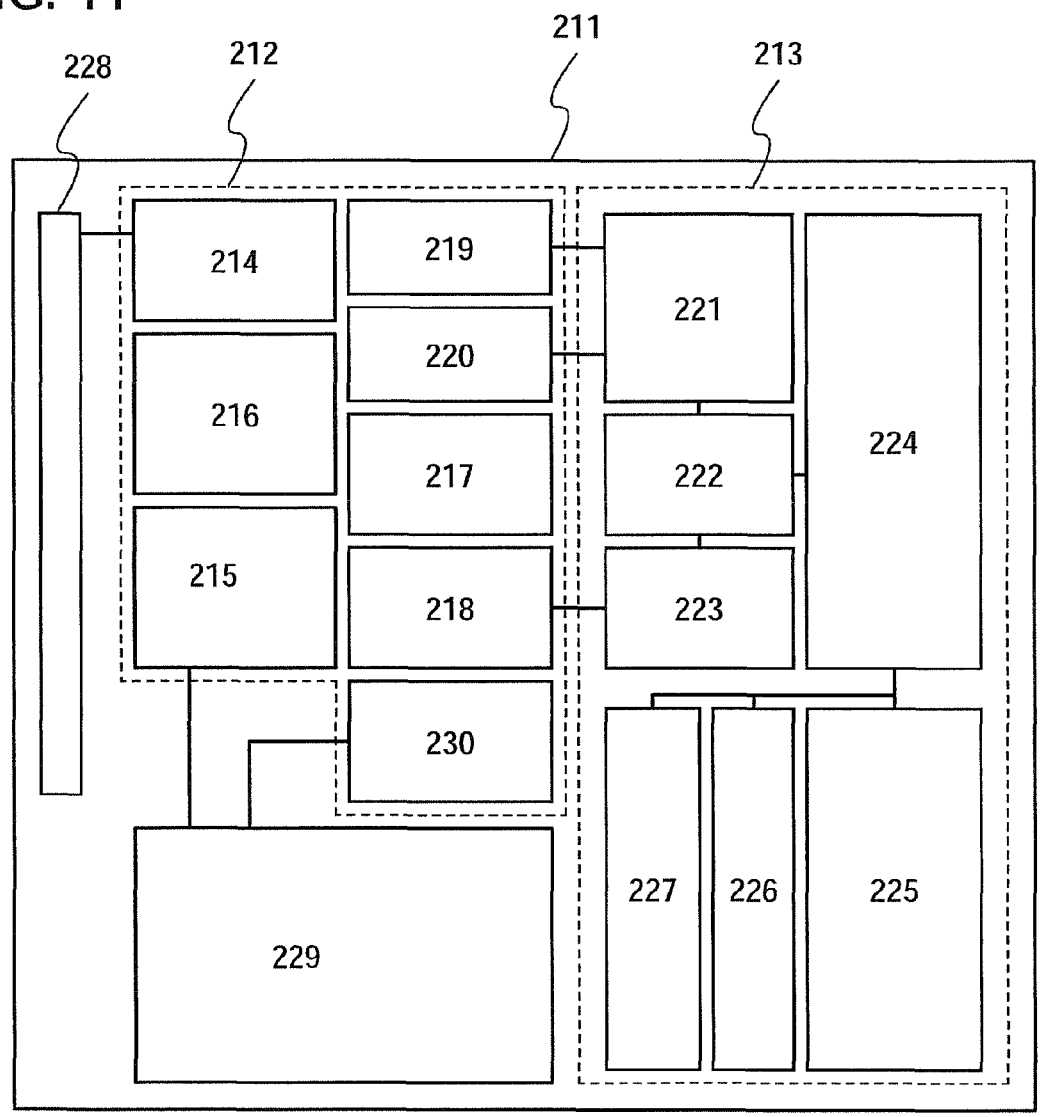
FIG. 11 is a block diagram showing a structure of an RFCPU that is obtained using an SOI substrate.

Next, an example of a semiconductor device having an arithmetic function that is capable of contactless data transmission and reception is described with reference to FIG. 11. FIG. 11 shows an example of a computer that operates to transmit and receive signals to and from an external device by wireless communication (such a computer is hereinafter referred to as an "RFCPU"). An RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, and a modulator circuit 220. The digital circuit portion 213 has an RF interface 221, a control register 222, a clock controller 223, an interface 224, a central processing unit 225, a random-access memory 226, and a read-only memory 227.

The operation of the RFCPU 211 having such a configuration is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable as long as the capacitor portion 229 is mounted as a different component on a substrate having an insulating surface which is included in the RFCPU 211.

The reset circuit 217 generates a signal for resetting and initializing the digital circuit portion 213. For example, the reset circuit 217 generates a signal which rises after rise in the power supply voltage with delay as a reset signal. The oscillator circuit 218 changes the frequency and duty ratio of a clock signal in response to a control signal generated by the constant voltage circuit 216. The demodulator circuit 219 formed using a low-pass filter binarizes the amplitude of, for example, a received amplitude-modulated (ASK) signal. The modulator circuit 220 varies the amplitude of an amplitude-modulated (ASK) transmission signal and transmits the signal. The modulator circuit 220 changes the amplitude of a communication signal by changing a resonance point of the resonance circuit 214. The clock controller 223 generates a control signal for changing the frequency and duty ratio of a clock signal in accordance with the power supply voltage or a consumption current of the central processing unit 225. The power supply voltage is managed by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the interface 224. The interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing is conducted by a dedicated arithmetic circuit and the other part of the arithmetic processing is conducted by the central processing unit 225 using a program.

In the RFCPU 211 as described above, by application of this mode, an integrated circuit can be formed using a single-crystal semiconductor layer that has good characteristics. Therefore, an increase in performance, an increase in speed such as operation speed, and the like can be achieved. Although FIG. 11 shows the mode of RFCPU, a device such as an IC tag is also possible as long as it has a communication function, an arithmetic processing function, and a memory function.

Figure 12:
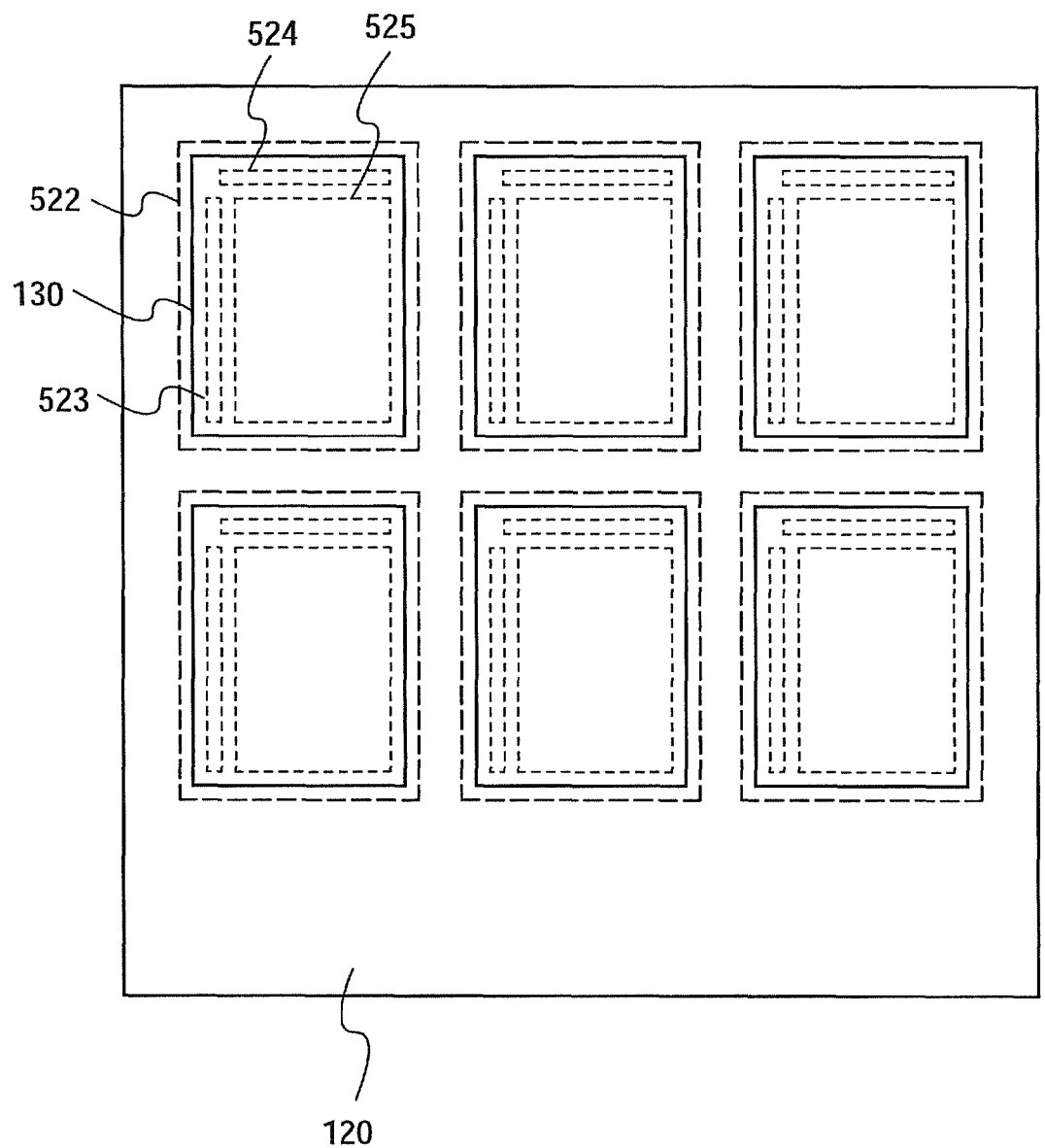
FIG. 12 is a diagram showing an example of bonding of a semiconductor layer to mother glass that is used for manufacturing display panels.

In addition, the semiconductor layer of this mode can also be bonded to a large-sized glass substrate called mother glass used to manufacture display panels. FIG. 12 shows the case where semiconductor layers 103 are bonded to mother glass used as a supporting substrate 120. A plurality of display panels is taken out from mother glass, and the semiconductor layers 130 are preferably bonded to match formation regions of display panels 522. Since a mother glass substrate has a larger area than a semiconductor substrate, it is preferable that a plurality of semiconductor layers 130 be arranged within the formation regions of the display panels 522, as shown in FIG. 12. When the plurality of semiconductor layers 130 is arranged over the supporting substrate 120, a sufficient space can be provided between adjacent semiconductor layers 130. Each of the display panels 522 includes a scan line driver circuit region 523, a signal line driver circuit region 524, and a pixel formation region 525. The semiconductor layer 130 is bonded to the supporting substrate 120 so that the display panel 522 can be formed to include these regions using a single semiconductor layer 130.

Figure 13A:
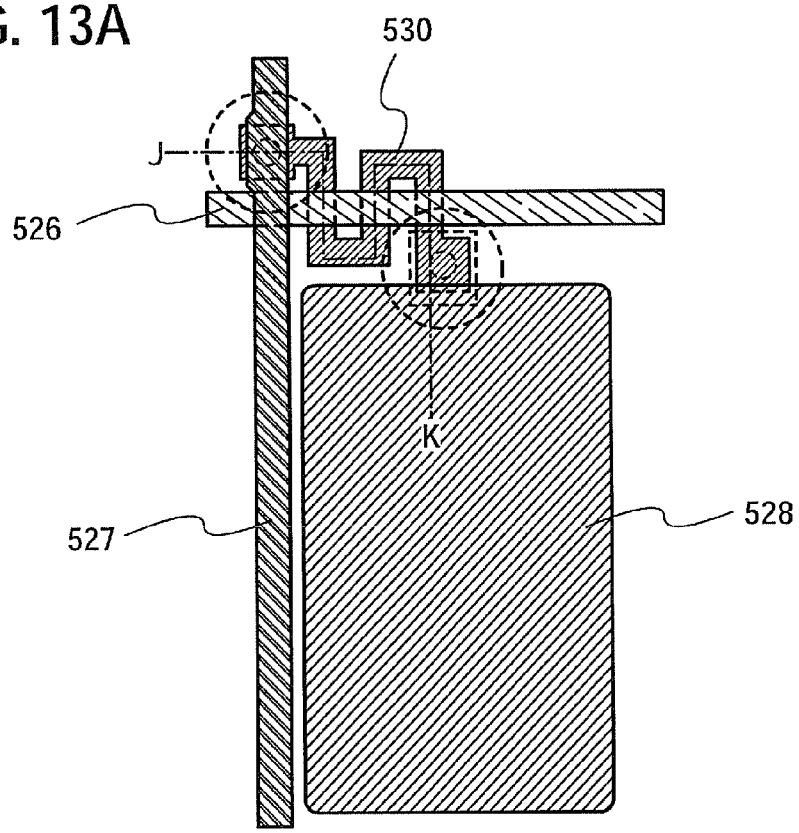
FIGS. 13A and 13B are diagrams showing an example of a liquid crystal display device.
Figure 13B:
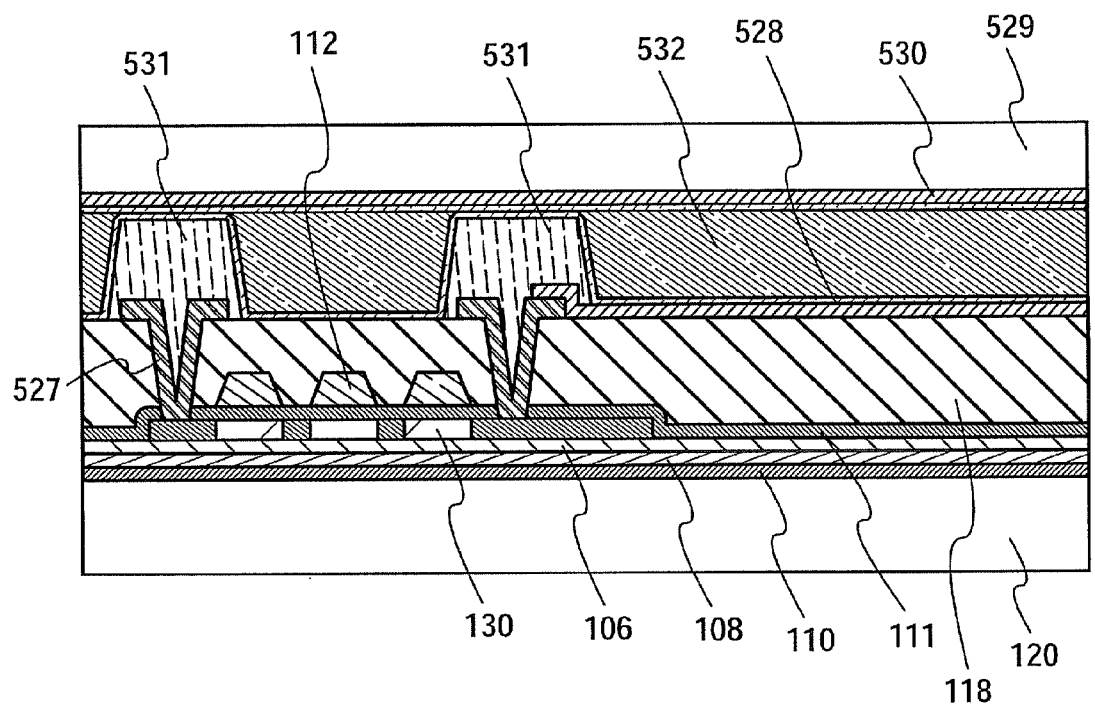

FIGS. 13A and 13B show an example of a pixel of a liquid crystal display device to which the SOI substrate of this mode is applied and in which a transistor of a pixel portion is formed using the semiconductor layer of the SOI substrate. FIG. 13A shows a plan view of a pixel, in which a scan line 526 intersects a semiconductor layer, and a signal line 527 and a pixel electrode 528 are connected to the semiconductor layer. FIG. 13B shows a cross-sectional view of FIG. 13A along a chain line J-K.

In FIG. 13B, there is a portion that has a structure in which a bonding layer 110, a silicon nitride oxide layer 108, a silicon oxynitride layer 106, and a semiconductor layer 130 are stacked over a supporting substrate 120, and a pixel transistor is formed to include such a region. In this mode, the semiconductor layer 130 is a single-crystal semiconductor layer. The pixel electrode 528 is provided over an interlayer insulating layer 118. In the interlayer insulating layer 118, a contact hole, through which the semiconductor layer 130 and the signal line 527 are connected to each other, is formed. A columnar spacer 531 is provided over the signal line 527 so as to fill a step due to the contact hole formed in the interlayer insulating layer 118. A counter substrate 529 is provided with a counter electrode 530, and a liquid crystal layer 532 is formed in a space formed by the columnar spacer 531.

Figure 14A:
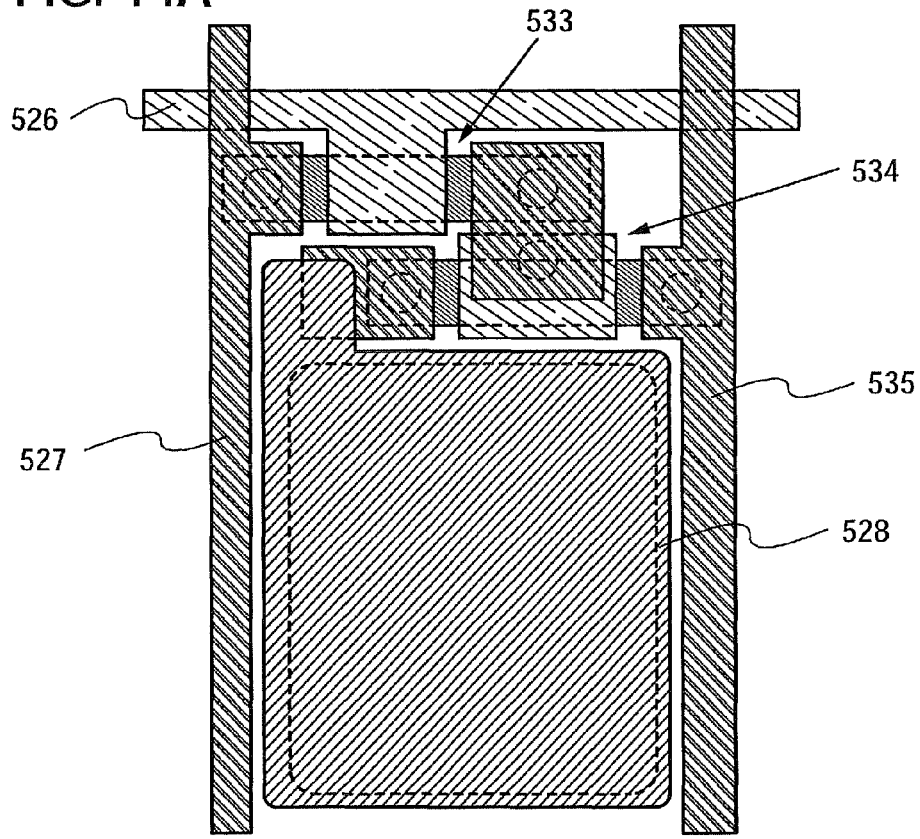
FIGS. 14A and 14B are diagrams showing an example of an electroluminescent display device.
Figure 14B:
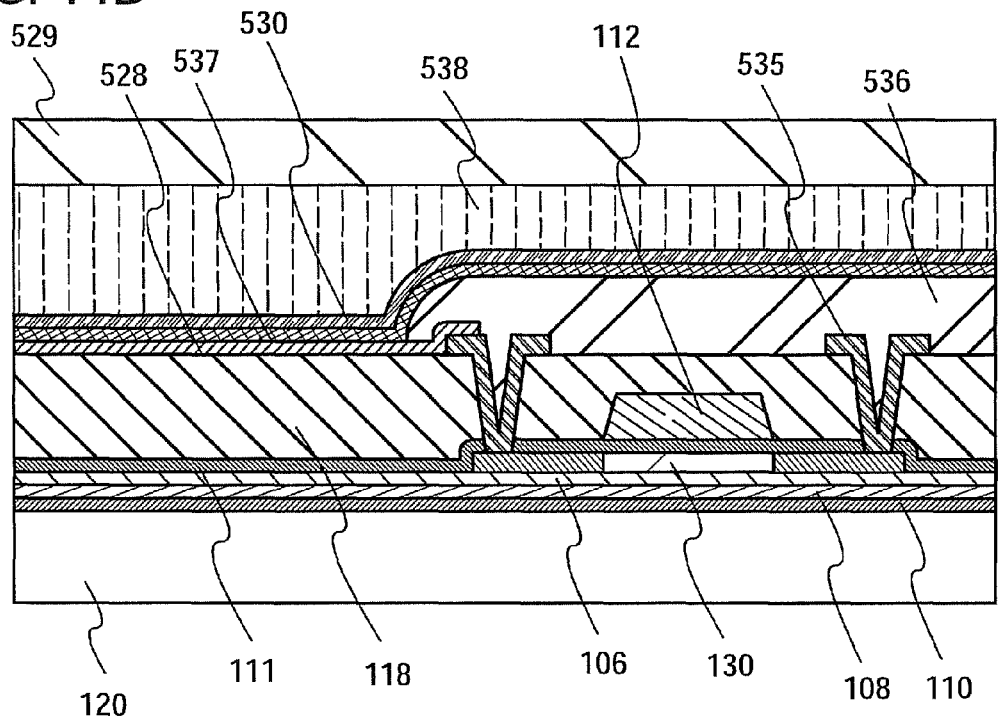

FIG. 14A shows an example of an electroluminescent (EL) display device to which the SOI substrate of this mode is applied and in which a transistor of a pixel portion is formed using the semiconductor layer of the SOI substrate. FIG. 14A shows a plan view of a pixel, which has a selection transistor 533 connected to a signal line 527 and a display control transistor 534 connected to a power supply line 135. This display device has a structure in which each pixel is provided with a light emitting element that has a layer (EL layer) formed to contain an electroluminescent material between electrodes. A pixel electrode 528 is connected to the display control transistor 534. FIG. 14B is a cross-sectional view showing a main portion of such a pixel.

In FIG. 14B, there is a portion that has a structure in which a bonding layer 110, a silicon nitride oxide layer 108, a silicon oxynitride layer 106, and a semiconductor layer 130 are stacked over a supporting substrate 120, and the display control transistor is formed to include such a region. In this mode, the semiconductor layer 130 is a single-crystal semiconductor layer. The structures of the bonding layer 110, the silicon nitride oxide layer 108, the silicon oxynitride layer 106, the semiconductor layer 130, an interlayer insulating layer 118, and the like are similar to those in FIG. 13B. A peripheral portion of a pixel electrode 528 is surrounded by an insulating partition layer 536. Over the pixel electrode 528, an EL layer 537 is formed. Over the EL layer 537, a counter electrode 530 is formed. The pixel portion is filled with a sealing resin 538 and is provided with a counter substrate 529 as a reinforcing plate.

In the electroluminescent display device of this mode, such pixels are arranged in a matrix to form a display screen. In this case, a channel portion of a transistor of each pixel is formed using the single-crystal semiconductor layer 130. Therefore, there are advantages in that characteristics do not vary from transistor to transistor and emission luminescence does not vary from pixel to pixel. Therefore, drive with the brightness of a light emitting element being controlled by a current becomes easy, and a correction circuit that corrects variation of transistor characteristics becomes unnecessary. Thus, a load on a driver circuit can be reduced. Furthermore, because a light-transmitting substrate can be selected as the supporting substrate 120, a bottom-emission electroluminescent display device which emits light from the supporting substrate 120 side can be formed.

As described above, a single-crystal semiconductor layer can be formed over mother glass, which is used to manufacture display devices, and a transistor can also be formed over mother glass. The transistor formed using the single-crystal semiconductor layer is superior to an amorphous silicon transistor in all operating characteristics such as current drive capability; therefore, the transistor can be downsized. Accordingly, an aperture ratio of a pixel portion in a display panel can be increased. Furthermore, because a microprocessor like the one illustrated in FIG. 10 or 11 can be formed, a display device can be provided with a function as a computer. Moreover, a display which is capable of inputting and outputting data without contact can be manufactured.

A variety of electronic devices can be formed using the SOI substrate of this mode. Examples of electronic devices include a camera such as a video camera or a digital camera, a navigation system, a sound reproducing device (a car audio, an audio component, or the like), a computer, a game machine, a portable information terminal (a mobile computer, a cellular phone, a mobile game machine, an electronic book, or the like), an image reproducing device having a recording medium (specifically, a device for reproducing a recording medium such as a digital versatile disc (DVD) and having a display for displaying the reproduced image), and the like.

Figure 15A:
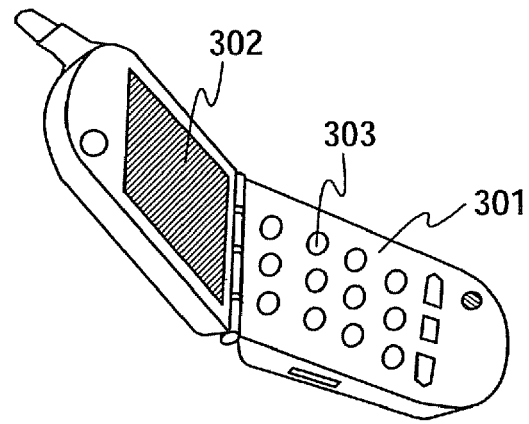
FIGS. 15A to 15C are diagrams each showing an example of an electric device.

FIG. 15A shows an example of a cellular phone. A cellular phone 301 described in this mode has a display portion 302, an operation portion 303, and the like. In the display portion 302, the liquid crystal display device described with reference to FIGS. 13A and 13B or the electroluminescent display device described with reference to FIGS. 14A and 14B can be used. With the use of the display device of this mode, a display portion with little display unevenness and high image quality can be formed. In addition, any of the semiconductor devices of this mode can be used for a microprocessor or a memory which is included in the cellular phone 301.

Figure 15B:
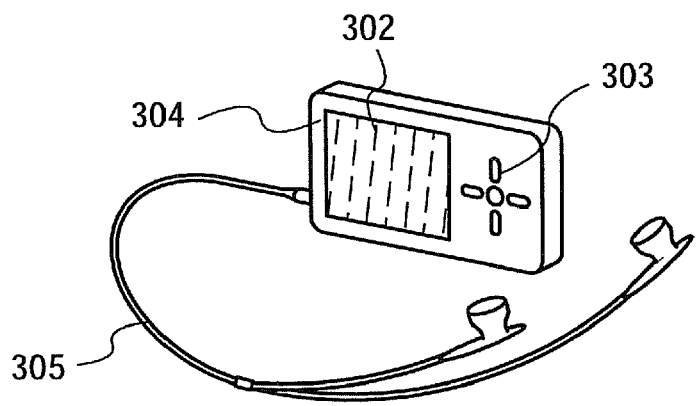

FIG. 15B shows a digital player 304, which is a typical example of an audio device. The digital player 304 shown in FIG. 15B has a display portion 302, an operation switch 303, earphones 305, and the like. Instead of the earphones 305, headphones or wireless earphones can be used. In the digital player 304, the semiconductor device of this mode can be used for a memory portion which stores music information or a microprocessor which operates the digital player 304. The digital player 304 having this structure can achieve reductions in size and weight. By application of the liquid crystal display device described with reference to FIGS. 13A and 13B or the electroluminescent display device described with reference to FIGS. 14A and 14B to the display portion 302, the display portion 302 can display an image or textual information with high definition even if it has a screen size of about 0.3 inches to 2 inches.

Figure 15C:
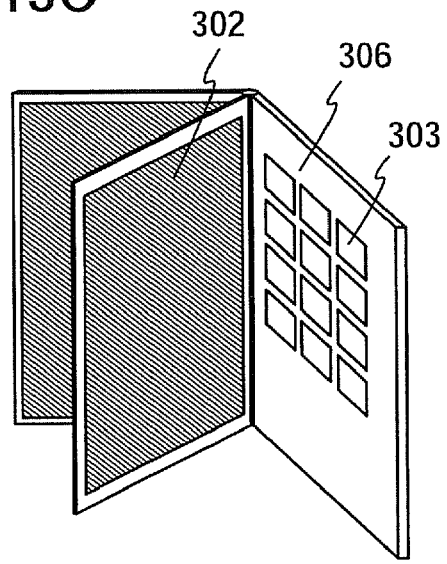

FIG. 15C shows an electronic book 306. This electronic book 306 has a display portion 302 and an operation switch 303. A modem may be built in, or a structure in which information can be transmitted and received wirelessly may be employed. In the electronic book 306, any of the semiconductor devices of this mode can be used for a memory portion which stores information or a microprocessor which operates the electronic book 306. In the memory portion, a NOR-type nonvolatile memory with a memory capacity of 20 gigabytes (GB) to 200 gigabytes (GB) can be used, with which images or sounds (music) can be stored and reproduced. By application of the liquid crystal display device described with reference to FIGS. 13A and 13B or the electroluminescent display device described with reference to FIGS. 14A and 14B to the display portion 302, the display portion 302 can perform display with high image quality.

Embodiment Mode 2

As described above in Embodiment Mode 1 with reference to FIGS. 7A1 to 7B2, in manufacturing an SOI substrate, there is the problem of defective bonding due to a fixing jig during ion irradiation. In this mode, an example of a structure of a doping apparatus for preventing defective bonding in manufacturing an SOI substrate is described.

Note that, in this specification, a doping apparatus includes an ion doping apparatus and an ion implantation apparatus. An ion doping apparatus refers to a non-mass-separation type apparatus for irradiating a process object positioned in a process chamber with all kinds of ions which are generated by plasma excitation of a source gas. In addition, an ion doping apparatus refers to an apparatus which does not have a mass separator. An ion implantation apparatus refers to a mass-separation type apparatus for separating a plurality of kinds of ions by mass which is generated by plasma excitation of a source gas and for irradiating a process object positioned in a process chamber with a specific kind of ions. In addition, an ion implantation apparatus refers to an apparatus which has a mass separator. Hereinafter, an example of a structure of a doping apparatus of this mode will be described.

Figure 16A:
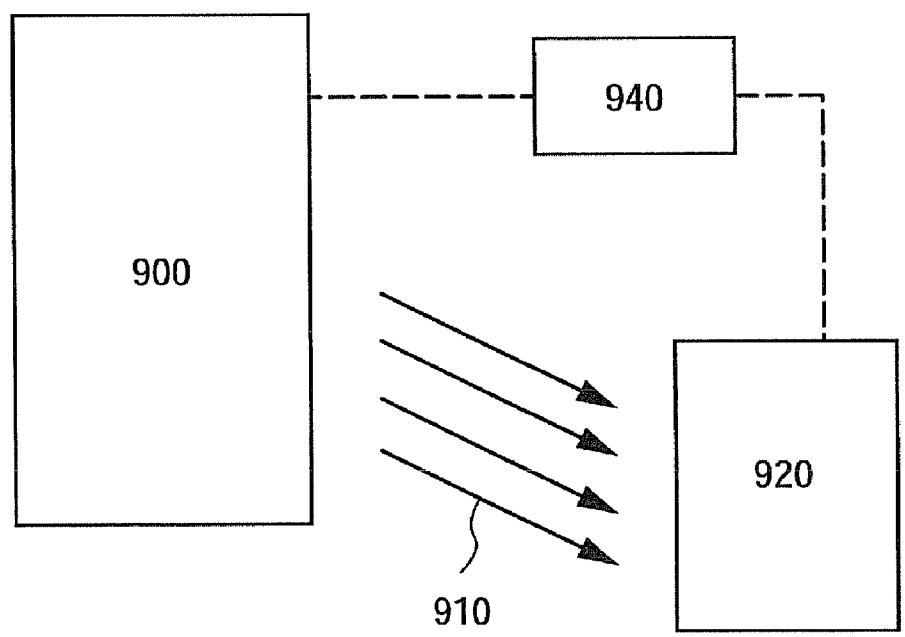
FIGS. 16A and 16B are diagrams showing a structure of a doping apparatus.
Figure 16B:
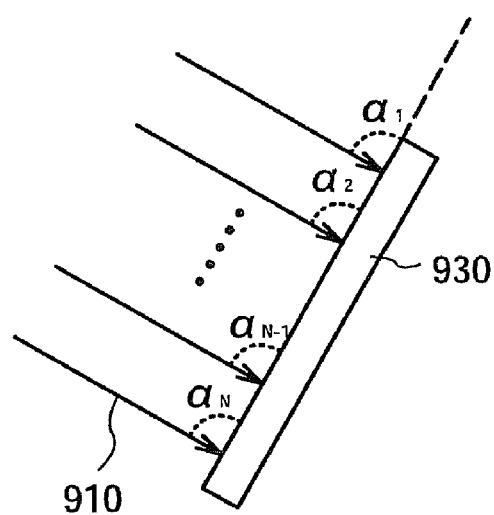

FIGS. 16A and 16B show schematic diagrams of a main portion of the doping apparatus of this mode. The doping apparatus of this mode has an ion irradiation mechanism 900, a substrate holding mechanism 920, and a control mechanism 940.

The ion irradiation mechanism 900 has an ion source for generating desired ions and an acceleration mechanism for irradiating a process substrate with ions. The ion source has a gas supply system for supplying a source gas from which a desired kind of ions is generated, an electrode for producing a plasma, and the like. As the electrode for producing a plasma, a capacitively-coupled high-frequency discharge electrode may be used, or a filament electrode may be used. The acceleration mechanism has a power source, an electrode, and the like. Examples of electrodes included in the acceleration mechanism are an extraction electrode, an accelerating electrode, a decelerating electrode, a ground electrode, and the like. These electrodes are provided with a number of openings or slits, through which ions that are generated from the ion source are accelerated.

The doping apparatus of this mode can be a mass-separation type ion implantation apparatus which has a mass separator, separates a plurality of kinds of ions by mass which is generated by plasma excitation of a source gas, and performs irradiation with a specific kind of ions. However, it is preferably a non-mass-separation type ion doping apparatus which can perform irradiation with ions of atoms of a single kind or a plurality of kinds that have different masses, which is generated by plasma excitation of a source gas. For example, when hydrogen is supplied as a source gas, it is preferably a doping apparatus which can perform irradiation with $H^+$ ions, $H_2^+$ ions, and $H_3^+$ ions.

The substrate holding mechanism 920 holds a process substrate to be irradiated with an ion beam and with ions included in the ion beam. In this mode, one feature of the substrate holding mechanism 920 is to hold a process substrate without the use of any fixing jig such as a clamp.

Specifically, a process substrate 930 is held while being tilted at a tilt angle θ (see FIG. 17A). The tilt angle θ is an angle between a process substrate 921 which is placed vertically and a process substrate 931 which is in a tilted position.

As shown in FIG. 17A, an example of a mode in which the process substrate 930 is held in a tilted position is a structure against which the process substrate 930 is held. Substrate holding mechanisms shown in FIG. 17B1 to 17B3 have mounting portions A 922 and a mounting portion B 924a, a mounting portion B 924b, and a mounting portion B924c for supporting the bottom of the process substrate 930, and back supporting portions 926 for supporting the backside of the process substrate 930. The process substrate 930 is held against the back supporting portion 926. The back supporting portion 926 is tilted at a desired tilt angle. By tilting of the back supporting portion 926 at a desired tilt angle, the tilt angle θ of the process substrate 930 can be controlled. Note that the shape of the back supporting portion 926 is not limited to that shown in the drawings, and it is acceptable as long as the process substrate 930 can be set against the back supporting portion 926.

The mounting portions B 924a to 924c each function to help the process substrate 930 to be in a tilted position against the back supporting portion 926 and may be provided between the bottom of the process substrate 930 and the mounting portion A 922, as necessary. The shape of the mounting portions B 924a to 924c is not particularly limited and may be either a cubic shape or a stick shape. For example, the mounting portion B 924a of FIG. 17B1 is entirely in contact with and supports the process substrate 930. Note that the edge portion of each of the mounting portions B 924a to 924c does not necessarily need to be aligned with the edge portion of the process substrate 930. For example, the edge portion of the mounting portion B 924b of FIG. 17B2 is shorter than the edge portion of the process substrate 930. Alternatively, the edge portion of each of the mounting portions B 924a to 924c may be longer than the edge portion of the process substrate 930. As shown in FIG. 17B3, a structure in which the mounting portion B 924c alone supports the bottom of the process substrate 930 and holds the process substrate 930 in a tilted position is also possible. With such a structure, the process substrate 930 can be held without the use of any fixing jig such as a clamp.

In another mode, a substrate holding mechanism shown in FIG. 17C may have a structure which has an electrostatic chuck 928 for holding the process substrate 930. With the use of the electrostatic chuck 928, the process substrate 930 can be held by suction without the use of any fixing jig such as a clamp. Note that, by tilting of the electrostatic chuck 928 at a desired tilt angle, the tilt angle θ of the process substrate 930 can be controlled. Furthermore, the back supporting portion 926 of each of the substrate holding mechanisms shown in FIG. 17B1 to 17B3 may be an electrostatic chuck.

In another mode, a structure in which the process substrate is held in a horizontal position is also possible. A substrate holding mechanism shown in FIG. 17D has a substrate holding portion 929 for holding the process substrate 930 horizontally. The substrate holding portion 929 is in a horizontal position and can hold the process substrate simply by mounting of the process substrate 930 on the substrate holding portion 929 without the use of any particular fixing jig. When P is added by an ion doping apparatus using $PH_3$ or when B is added using $B_2H_6$, a film originating from $PH_3$ or $B_2H_6$ is likely to be formed in an ion source. The film tends to generate particles, and if the particles are attached to a process substrate, there are cases where ions are not added to the process substrate. However, when $H_2$, He, or the like is used, no film is formed in an ion source. Therefore, the influence of particles, which cause a problem when P or B is added, can be eliminated. Therefore, a doping process can also be performed with a process substrate placed horizontally.

Note that the tilt angle θ of the process substrate 930 is not particularly limited as long as the process substrate 930 can easily be held, but it is preferable that the tilt angle θ satisfy the range of $10°≦θ<90°$, more preferably, $30°≦θ<90°$, still more preferably, $45°≦θ<90°$. Alternatively, it is preferable that the tilt angle θ satisfy the range of $10°≦θ90°$, more preferably, $30°≦θ≦90°$, still more preferably, $45°≦θ≦90°$. Note that it is preferable that the tilt angle θ be set in consideration of the irradiation direction and incidence angle of an ion beam with which the process substrate 930 is irradiated, and the like.

The ion irradiation mechanism 900 irradiates the process substrate 930, which is held by the substrate holding mechanism 920, with an ion beam 910. The ion beam is ions which are generated and accelerated by the ion irradiation mechanism 900. The process substrate 930 is irradiated with the ion beam 910 at an incidence angle a as shown in FIG. 16B, for example. The incidence angle α is an angle between the surface of the process substrate 930 and the ion beams 910 with which the process substrate 930 is irradiated. In addition, it can be said that the incidence angle α be an angle between the irradiation direction of the ion beam and the direction of a perpendicular to the surface of the process substrate. The incidence angle α of the ion beam corresponds to an irradiation angle of ions included in the ion beam. Therefore, the incidence angle a can also be the irradiation angle α.

Note that it is very difficult to control the trajectories of the ion beams 910, with which the ion irradiation mechanism 900 irradiates the process substrate 930, to be parallel to each other. Therefore, the incidence angles a of the ion beams 910 on the process substrate 930 tend to vary. In this mode, it is preferable that the incidence angle α of each of the ion beams 910 with which the process substrate 930 is irradiated be controlled to be in the range of 80° to 100°. It is more preferable that the average of the incidence angles α of the ion beams 910 with which the process substrate 930 is irradiated be controlled to be in the range of 85° to 95°.

For example, FIG. 16B shows an example in which the process substrate 930 is irradiated with N ion beams 910 at incidence angels $α_1$ to $α_N$. In this case, it is preferable that each of the incidence angles $α_1$ to $α_N$ be in the range of 80° to 100°. It is also preferable that the average of the incidence angles $α_1$ to $α_N$ be in the range of 85° to 95°.

By control of the incidence angle α of the ion beam on the process substrate within the above-mentioned range, the entire surface of the process substrate can be evenly irradiated with ions. In particular, the outer edge of the process substrate can also be irradiated with ions sufficiently. Therefore, in manufacturing an SOI substrate by utilizing separation of a semiconductor substrate through ion irradiation, an embrittled layer can be entirely formed in the process substrate, and defective bonding such as defective transfer can be prevented.

The control mechanism 940 controls the ion irradiation mechanism 900 to control the incidence angle α of the ion beam 910. Alternatively, a structure in which the control mechanism 940 controls the substrate holding mechanism 920 to control the tilt angle θ of the process substrate 930 is also possible. Note that, although the control mechanism 940 is separately provided in this mode, the present invention is not particularly limited thereto. A structure in which the ion irradiation mechanism 900 and the substrate holding mechanism 920 each have a control function is also possible.

With the use of the doping apparatus described in this mode, ion irradiation for manufacturing an SOI substrate can be performed. For example, as a process substrate, a single-crystal semiconductor substrate is prepared. The single-crystal semiconductor substrate is held by any of the substrate holding mechanisms shown in FIGS. 17B1 to 17B3. The single-crystal semiconductor substrate is held by the back supporting portion 926 while being tilted at a desired tilt angle θ. In addition, the single-crystal semiconductor substrate can be held without the use of any fixing jig such as a clamp. The single-crystal semiconductor substrate is irradiated with an ion beam. The ion beam includes ions of atoms of a single kind or a plurality of kinds that have identical mass or with ions of atoms of a single kind or a plurality of kinds that have different masses. For example, hydrogen is used as a source gas, and irradiation with an ion beam which includes $H^+$, $H_2^+$, and $H_3^+$ ions, which are ions of atoms of a single kind or a plurality of kinds that have different masses, is performed. In the single-crystal semiconductor substrate irradiated with the ion beam, an embrittled layer is formed. Note that, because the single-crystal semiconductor substrate is held without the use of any fixing jig such as a clamp, there is no unnecessary mask during ion irradiation, and the entire surface of the single-crystal semiconductor substrate can be irradiated with ions. Therefore, defective bonding such as defective transfer due to defective ion irradiation can be prevented, which leads to an increase of yield in manufacture of an SOI substrate.

Embodiment 1

In this embodiment, the suppression of defective bonding, which is achieved by selective etching of the outer edge of a semiconductor substrate provided with an embrittled layer to a region at a greater depth than the embrittled layer, is described.

In this embodiment, by application of the present invention, an SOI substrate A was manufactured, which was obtained by selective etching of the outer edge of a semiconductor substrate provided with an embrittled layer to a region at a greater depth than the embrittled layer and by separation of the semiconductor substrate at the embrittled layer after the semiconductor substrate and a supporting substrate were bonded together.

First, a method for manufacturing the SOI substrate A is described with reference to FIGS. 19A1 to 19E2. Note that FIGS. 19A1 to 19E1 are top views which schematically show the method for manufacturing the SOI substrate A, and FIGS. 19A2 to 19E2 are cross-sectional views of the top views taken along chain line o-p.

As shown in FIGS. 19A1 and 19A2, a single-crystal silicon substrate 800 with a thickness of about 700 μm was used as a semiconductor substrate, and over one surface of the single-crystal silicon substrate 800, a silicon oxynitride layer 802 with a thickness of 100 nm, a silicon nitride oxide layer 804 with a thickness of 50 nm, and a silicon oxide layer 806 with a thickness of 50 nm were stacked in this order.

Next, the single-crystal silicon substrate 800 was set in a chamber of an ion doping apparatus, and four portions of the single-crystal silicon substrate 800 were fixed by a clamp 809. Then, the single-crystal silicon substrate 800 was irradiated with ions, which were generated using the ion doping apparatus by plasma excitation of hydrogen used as a source gas, from the side where the silicon oxynitride layer 802 to the silicon oxide layer 806 were formed, whereby an embrittled layer 808 was formed. The accelerating voltage and the like were adjusted so that the embrittled layer 808 was formed at about 170 nm from the surface on which the silicon oxynitride layer 802 was formed. Note that, here, the proportion of $H_3^+$ ions to all kinds of ions, which are generated by the ion doping apparatus and with which the single-crystal silicon substrate 800 was irradiated using the ion doping apparatus, was 80% or higher. In addition, at this time, a part of the clamp 809 overlapped with the silicon oxide layer 806.

After the single-crystal silicon substrate 800 provided with the embrittled layer 808 was taken out of the ion doping apparatus, as shown in FIGS. 19B1 and 19B2, a resist layer 810 was formed over the silicon oxide layer 806 which was formed over the single-crystal silicon substrate 800.

Here, the formation of the resist layer 810 is specifically described. First, a resist layer was formed entirely over the silicon oxide layer 806 using a photoresist (THMR-iP3300 LB, with a viscosity of 8 cP, manufactured by Tokyo Ohka Kogyo Co. Ltd.). The resist layer was formed by application of the photoresist with substrate rotational speed set so that the thickness was about 1.8 μm. At this time, after the application of the photoresist, the removal of the photoresist attached to the outer edge of the substrate (specifically, the edge and the backside of the substrate), a so-called edge bead removal (EBR) process, was performed. The EBR process was performed using a thinner (OK73 thinner (PGME: 70%, PGMEA: 30%), manufactured by Tokyo Ohka Kogyo Co., Ltd.). Next, edge exposure and development were performed to remove the outer edge of the resist layer which was almost entirely formed over the silicon oxide layer 806, whereby the resist layer 810 was formed. The edge exposure was performed using a high-pressure mercury lamp as a light source by irradiation of a peripheral region of 8 mm at an irradiation intensity per unit area of 350 mW/cm². Subsequently, the development was performed using a developing solution (an aqueous solution of 2.38% of NMD3 TMAH, manufactured by Tokyo Ohka Kogyo Co., Ltd.) for a process time of 69 sec. The resist layer 810 formed in this manner was slightly smaller than the single-crystal silicon substrate 800 when seen from above (the distance between the edge portion of the resist layer 810 and the edge portion of the silicon oxide layer 806 (the single-crystal silicon substrate 800) was about 8 mm).

Next, with the use of the resist layer 810 as a mask, the single-crystal silicon substrate 800 was selectively etched on the side where the silicon oxynitride layer 802 to the silicon oxide layer 806 were formed (see FIGS. 19C1 and 19C2). At this time, the single-crystal silicon substrate 800 was etched to a region at a greater depth than the embrittled layer 808, specifically, to a region at a depth of about 1 μm from the surface in contact with the silicon oxynitride layer 802. In the etching, the silicon oxide layer 806 to the silicon oxynitride layer 802 were etched first by a wet etching method, and the single-crystal silicon substrate 800 was then etched by a dry etching method. The silicon oxide layer 806 to the silicon oxynitride layer 802 were etched using an aqueous solution of hydrofluoric acid (high-purity buffered hydrofluoric acid LAL500 (a mixed aqueous solution of $NH_4HF_2$ (7.13%) and $NH_4F$ (15.37%)), manufactured by Stella Chemifal Corporation) at a process temperature of 20° C. for a process time of 6 min. Subsequently, the single-crystal silicon substrate 800 was etched 1 μm deep in a reactive ion etching (RIE) mode using an SF$_6$ gas and a He gas with a flow-rate ratio of SF$_6$ to He set to be 28:12 (sccm).

Next, after the resist layer 810 which was no longer necessary was removed, as shown in FIGS. 19D1 and 19D2, the single-crystal silicon substrate 800 and a glass substrate 820 serving as a supporting substrate were superposed on each other and bonded to each other with the silicon oxynitride layer 802 to the silicon oxide layer 806 interposed therebetween. Specifically, one surface of the glass substrate 820 and one surface of the silicon oxide layer 806 (the surface not in contact with the silicon nitride oxide layer 804) were located in contact with each other, whereby a bond was formed.

Figure 20A:
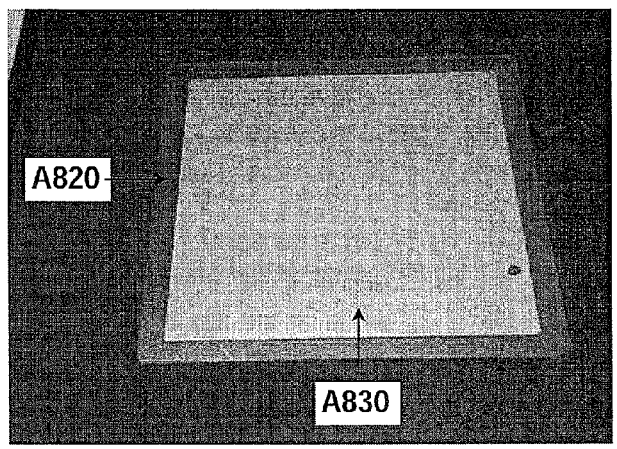
FIGS. 20A to 20D are a photograph of an SOI substrate A manufactured by applying the present invention and photographs of SOI substrates B and C which are manufactured as comparative examples.

Next, heat treatment was performed to separate the single-crystal silicon substrate 800 and to form a single-crystal silicon layer 830 over the glass substrate 820, whereby the SOI substrate A was obtained (see FIGS. 19E1 and 19E2). FIG. 20A shows a photograph of the top surface of the SOI substrate A that was manufactured as described above. In FIG. 20A, a glass substrate A 820 and a single-crystal silicon layer A 830 provided over the glass substrate A 820 can be identified.

Figure 20B:
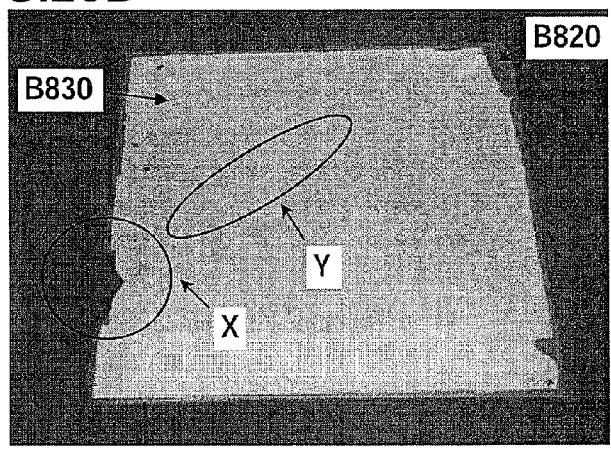
Figure 20C:
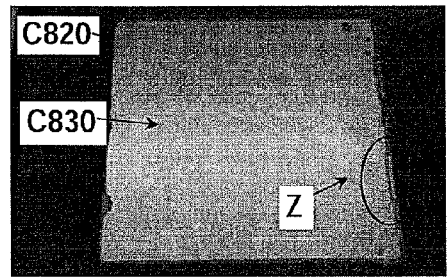
Figure 20D:
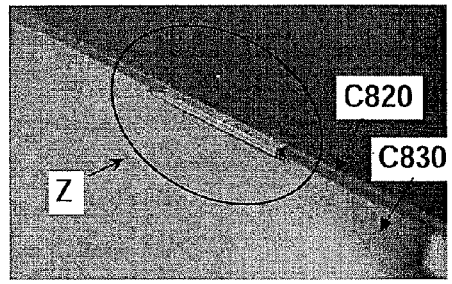

As comparative examples, SOI substrates B and C were manufactured. The comparative examples, the SOI substrates B and C, were each manufactured by bonding of a semiconductor substrate, which was provided with an embrittled layer without selective etching of the outer edge of the semiconductor substrate, and a supporting substrate to each other and then by separation of the semiconductor substrate at the embrittled layer. That is, the SOI substrates B and C were manufactured by the manufacturing method shown in FIGS. 19A1 to 19E2 without performing the steps shown in FIGS. 19B1, 19B2, 19C1, and 19C2. Note that each of the SOI substrates B and C was not separated at the embrittled layer even after the heat treatment was performed; therefore, these were separated here by a strong force with human hands. FIG. 20B shows a photograph of the top surface of the SOI substrate B. In FIG. 20B, a glass substrate B 820 and a single-crystal silicon layer B 830 provided over the glass substrate B 820 can be identified. FIG. 20C shows a photograph of the SOI substrate C, and FIG. 20D shows a partially enlarged photograph of the SOI substrate C (an enlarged photograph of a region Z which is circled in FIG. 20C). In FIGS. 20C and 20D, a glass substrate C 820 and a single-crystal silicon layer C 830 provided over the glass substrate C 820 can be identified.

It can be confirmed from FIG. 20A that it was possible to manufacture the SOI substrate A by applying the present invention without generating any crack or loss and without leaving a portion of the single-crystal silicon substrate that served as the base remaining. That is, it can be confirmed that no defective bonding has occurred on the outer edge of the SOI substrate A. In contrast, as shown in FIG. 20B, loss (a circled region X) and a crack (a circled region Y) were generated in the SOI substrate B. In the SOI substrate C, as shown in FIGS. 20C and 20D, a part of the single-crystal silicon substrate 800 is left remaining (a circled region Z). Each of the SOI substrates B and C could not be separated by heat treatment alone and had to be separated by a physical force. Note that, in the single-crystal silicon layer A 830 of FIG. 20A, a round portion where the single-crystal silicon layer A 830 is absent can be identified. However, this is a defect caused by attachment of dust to a bonding surface at the time of bonding and is not particularly relevant to the present invention.

It can be seen from the above results that defective bonding in manufacturing an SOI substrate can be prevented by applying the present invention.

Embodiment 2

In this embodiment, an ion irradiation method in forming an embrittled layer is considered.

In the embodiment mode described above, in forming an embrittled layer, a single-crystal semiconductor substrate is irradiated with ions that are derived from hydrogen (H) (hereafter referred to as "hydrogen ion species"). More specifically, a hydrogen gas or a gas which contains hydrogen in its composition is used as a source material; a hydrogen plasma is generated; and a single-crystal semiconductor substrate is irradiated with the hydrogen ion species in the hydrogen plasma.

(Ions in Hydrogen Plasma)

In such a hydrogen plasma as described above, hydrogen ion species such as H$^+$ ions, H$_2^+$ ions, and H$_3^+$ ions are present. Here are listed reaction equations for reaction processes (formation processes, destruction processes) of the hydrogen ion species.

$$e + H \to e + H^+ + e \quad (1)$$

$$e + H_2 \to e + H_2^+ + e \quad (2)$$

$$e + H_2 \to e + (H_2)^* \to e + H + H \quad (3)$$

$$e + H_2^+ \to e + (H_2^+)^* \to e + H^+ + H \quad (4)$$

$$H_2^+ + H_2 \to H_3^+ + H \quad (5)$$

$$H_2^+ + H_2 \to H^+ + H + H_2 \quad (6)$$

$$e + H_3^+ \to e + H^+ + H + H \quad (7)$$

$$e + H_3^+ \to H_2 + H \quad (8)$$

$$e + H_3^+ \to H + H + H \quad (9)$$

Figure 21:
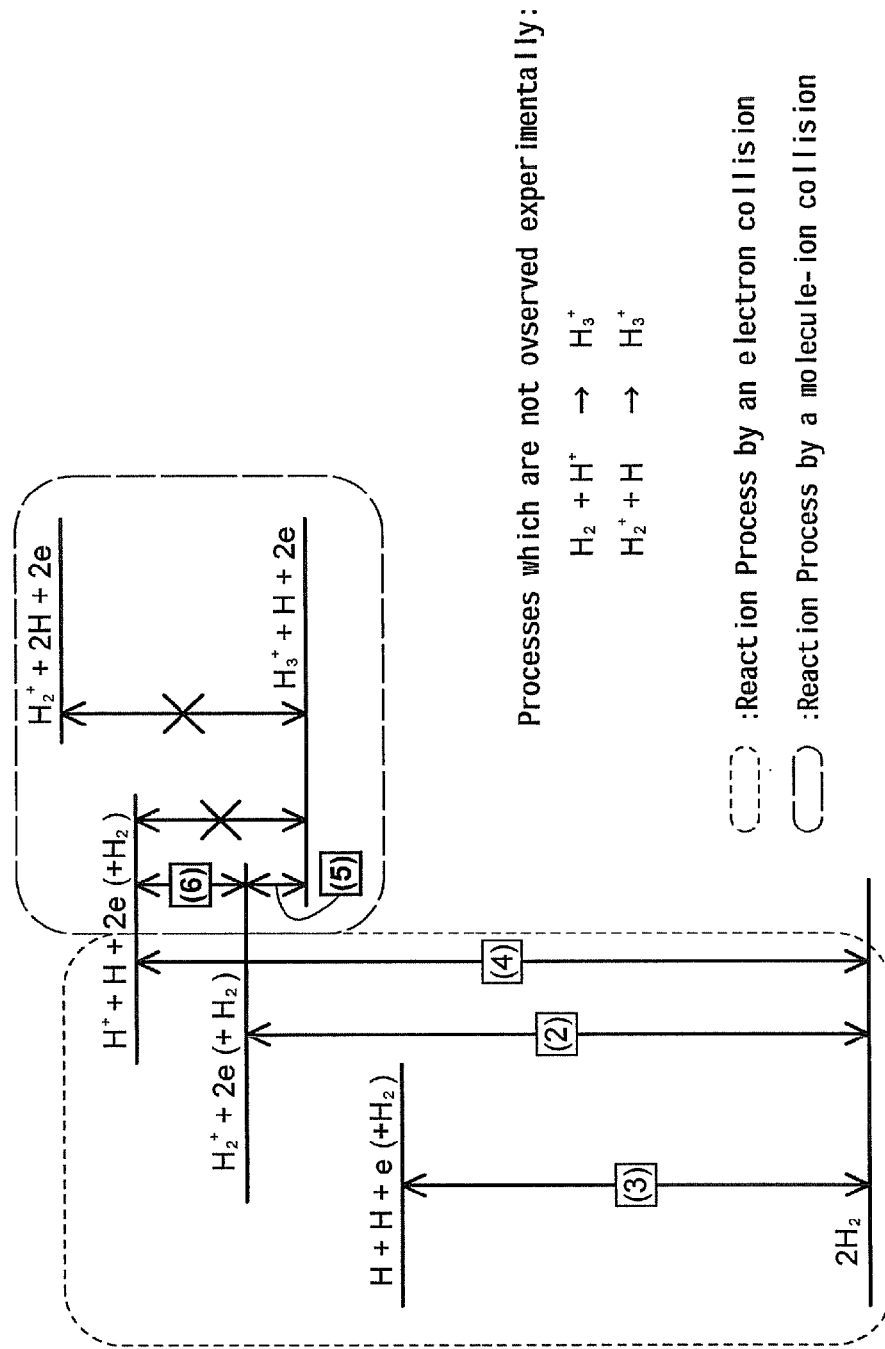
FIG. 21 is an energy diagram of hydrogen ion species.

FIG. 21 is an energy diagram which schematically shows some of the above reactions. Note that the energy diagram shown in FIG. 21 is merely a schematic diagram and does not depict the relationships of energies of the reactions exactly.

(H$_3^+$ Ion Formation Process)

As shown above, H$_3^+$ ions are mainly produced through the reaction process that is represented by the reaction equation (5). On the other hand, as a reaction that competes with the reaction equation (5), there is the reaction process represented by the reaction equation (6). For the number of H$_3^+$ ions to increase, at the least, it is necessary that the reaction of the reaction equation (5) occur more often than the reaction of the reaction equation (6) (note that, because there are also other reactions, (7), (8), and (9), through which the number of H$_3^+$ ions is decreased, the number of H$_3^+$ ions is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of H$_3^+$ ions in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of an H$_2^+$ ion is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of an $H_2^+$ ion is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$ ions. Assuming that an electric field is present as in a plasma generation chamber, the kinetic energy of an $H_2^+$ ion is high in a situation where the pressure inside the chamber is low and the kinetic energy of an $H_2^+$ ion is low in a situation where the pressure inside the chamber is high. That is, because the reaction of the reaction equation (6) is the main reaction in the situation where the pressure inside the chamber is low, the number of $H_3^+$ ions tends to be decreased, and because the reaction of the reaction equation (5) is the main reaction in the situation where the pressure inside the chamber is high, the number of $H_3^+$ ions tends to be increased. In addition, in a situation where an electric field in a plasma generation region is high, that is, in a situation where the potential difference between given two points is large, the kinetic energy of an $H_2^+$ ion is high, and in the opposite situation, the kinetic energy of an $H_2^+$ ion is low. That is, because the reaction of the reaction equation (6) is the main reaction in the situation where the electric field is high, the number of $H_3^+$ ions tends to be decreased, and because the reaction of the reaction equation (5) is the main reaction in a situation where the electric field is low, the number of $H_3^+$ ions tends to be increased.

(Differences Depending on Ion Source)

Figure 22:
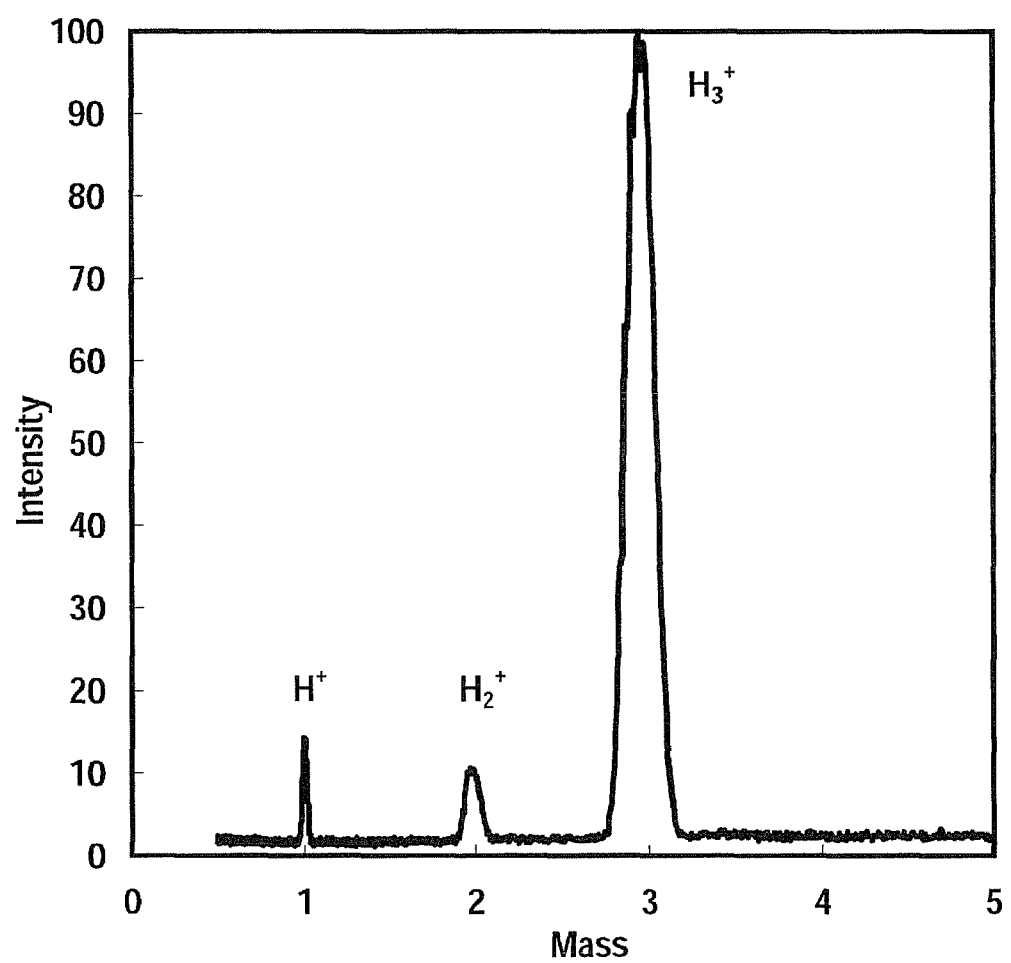
FIG. 22 is a diagram showing the results of ion mass spectrometry.

Here, an example, in which the proportions of hydrogen ion species (particularly, the proportion of $H_3^+$ ions) are different, is described. FIG. 22 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$ ions, $H_2^+$ ions, and $H_3^+$ ions, respectively. The vertical axis represents the intensity of the spectrum, which corresponds to the number of ions. In FIG. 22, the number of ions with different masses is expressed as a relative proportion where the number of ions with a mass of 3 is defined as 100. It can be seen from FIG. 22 that the ratio between ion species that are generated from the ion source, i.e., the ratio between $H^+$ ions, $H_2^+$ ions, and $H_3^+$ ions, is about 1:1:8. Note that ions at such a ratio can also be generated by an ion doping apparatus which has a plasma source portion (ion source) that generates a plasma, an extraction electrode that extracts an ion beam from the plasma, and the like.

Figure 23:
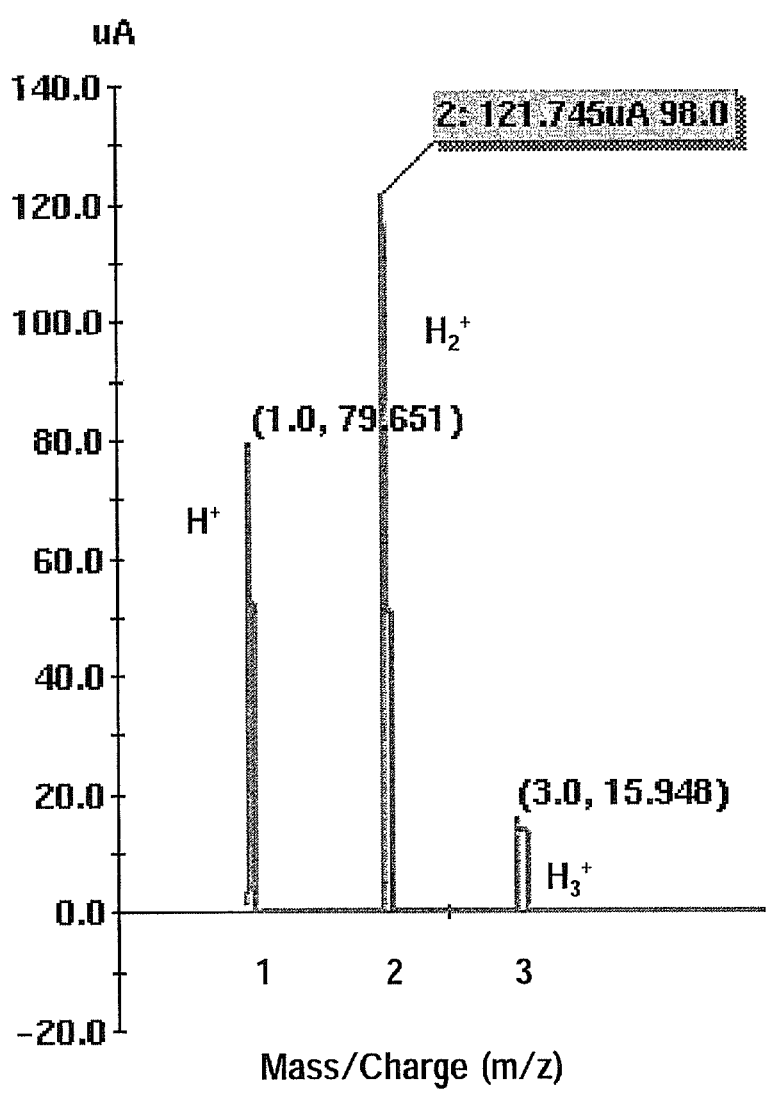
FIG. 23 is a diagram showing the results of ion mass spectrometry.

FIG. 23 is a graph showing the results of mass spectrometry of ions that are generated from $PH_3$ when an ion source different from that for the case of FIG. 22 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 22, the horizontal axis represents ion mass, and the mass 1 peak, the mass 2 peak, and the mass 3 peak correspond to $H^+$ ions, $H_2^+$ ions, and $H_3^+$ ions, respectively. The vertical axis represents the intensity of a spectrum corresponding to the number of ions. It can be seen from FIG. 23 that the ratio between ion species in a plasma, i.e., the ratio between $H^+$ ions, $H_2^+$ ions, and $H_3^+$ ions, is about 37:56:7. Note that, although FIG. 23 shows the data obtained when the source gas is $PH_3$, the ratio between the hydrogen ion species is about the same when a 100% hydrogen gas is used as a source gas, as well.

In the case of the ion source from which the data shown in FIG. 23 is obtained, $H_3^+$ ions, of $H^+$ ions, $H_2^+$ ions, and $H_3^+$ ions, is generated at a proportion of only about 7%. On the other hand, in the case of the ion source from which the data shown in FIG. 22 is obtained, the proportion of $H_3^+$ ions can be up to 50% or higher (under the aforementioned conditions, about 80%). This is thought to result from the pressure and electric field inside a chamber, which is clearly shown in the above consideration.

($H_3^+$ Ion Irradiation Mechanism)

When a plasma that contains a plurality of kinds of ions as shown in FIG. 22 is generated and a single-crystal semiconductor substrate is irradiated with the generated plurality of kinds of ions without any mass separation being performed, the surface of the single-crystal semiconductor substrate is irradiated with each of $H^+$ ions, $H_2^+$ ions, and $H_3^+$ ions. In order to reproduce the mechanism, from the irradiation with ions to the formation of an ion-introduced region, the following five types of models are considered.

Model 1, where the hydrogen ion species used for irradiation is $H^+$ ions, which are still $H^+$ ions (or H) after the irradiation.

Model 2, where the hydrogen ion species used for irradiation is $H_2^+$ ions, which are still $H_2^+$ ions (or $H_2$) after the irradiation.

Model 3, where the hydrogen ion species used for irradiation is $H_2^+$ ions, which each split into two H atoms (or $H^+$ ions) after the irradiation.

Model 4, where the hydrogen ion species used for irradiation is $H_3^+$ ions, which are still $H_3^+$ ions (or $H_3$) after the irradiation.

Model 5, where the hydrogen ion species used for irradiation is $H_3^+$ ions, which each split into three H atoms (or $H^+$ ions) after the irradiation.

(Comparison of Simulation Results with Measured Values)

Based on the above models, the irradiation of a silicon substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ ions replaced by $H^+$ ions that each have twice the mass. In addition, a calculation based on Model 4 was performed with the $H_3^+$ ions replaced by $H^+$ ions that each have three times the mass. Furthermore, a calculation based on Model 3 was performed with the $H_2^+$ ions replaced by $H^+$ ions that each has half the kinetic energy, and a calculation based on Model 5, with the $H_3^+$ ions replaced by $H^+$ ions that each have one-third the kinetic energy.

Note that SRIM is software intended for amorphous structures, but SRIM can be applied to cases where irradiation with the hydrogen ion species is performed with high energy at a high dose. This is because the crystal structure of a silicon substrate changes into a non-single-crystal structure due to the collision of the hydrogen ion species with Si atoms.

Figure 24:
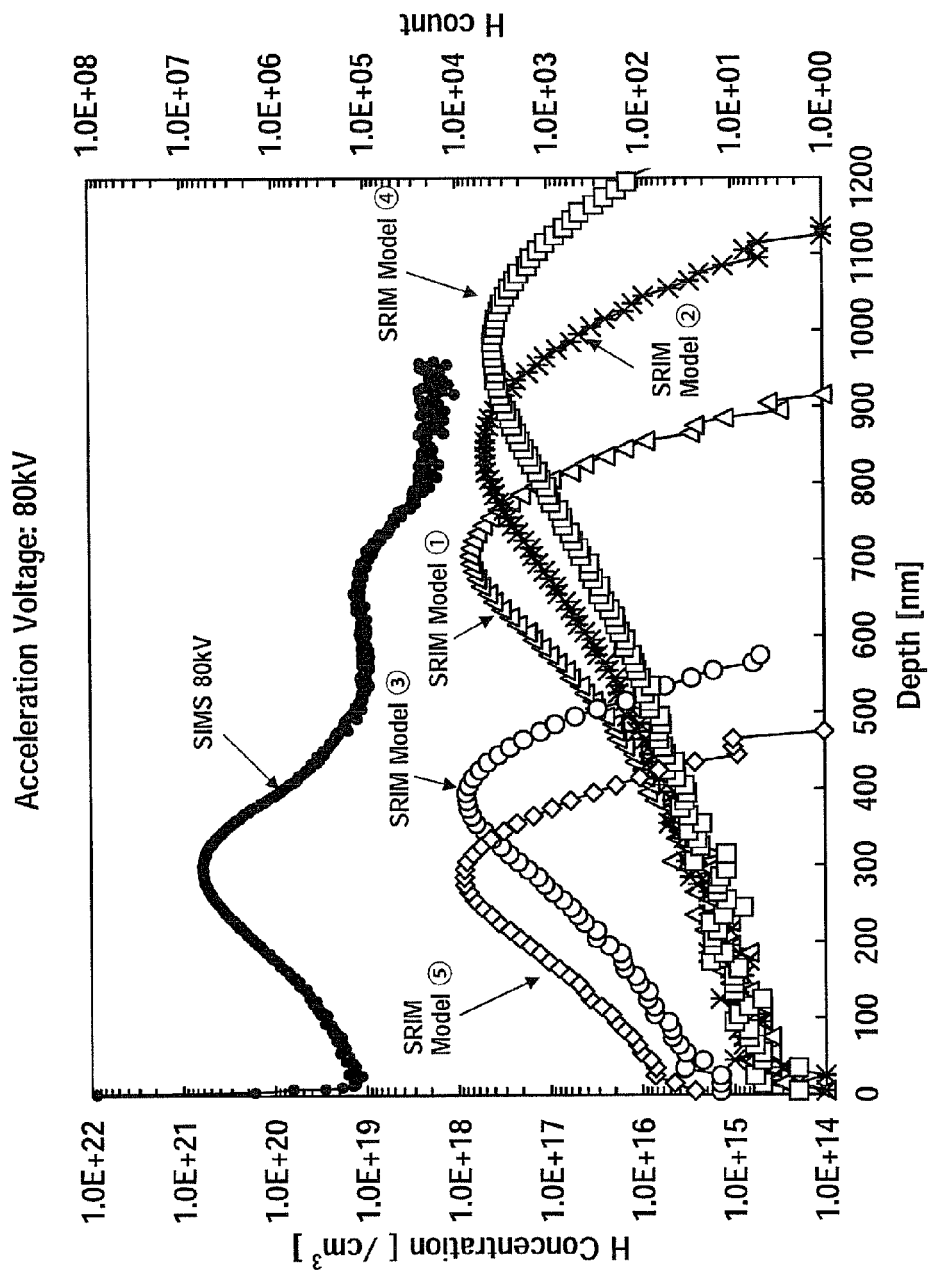
FIG. 24 is a diagram showing the profile (measured values and calculated values) of hydrogen in the depth direction when the accelerating voltage is 80 kV.

FIG. 24 shows the calculation results obtained when irradiation with the hydrogen ion species (irradiation with 100,000 atoms for H) is performed using Models 1 to 5. FIG. 24 also shows the hydrogen concentration (secondary ion mass spectrometry (SIMS) data) in a silicon substrate irradiated with the hydrogen ion species of FIG. 22. The results of calculations performed using Models 1 to 5 are expressed on the vertical axis (right axis) as the number of hydrogen atoms, and the SIMS data is expressed on the vertical axis (left axis) as the concentration of hydrogen atoms. The horizontal axis represents depth from the surface of a silicon substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small because $H_2^+$ ions and $H_3^+$ ions mostly split into $H^+$ ions or H ions by colliding with Si atoms.

Figure 25:
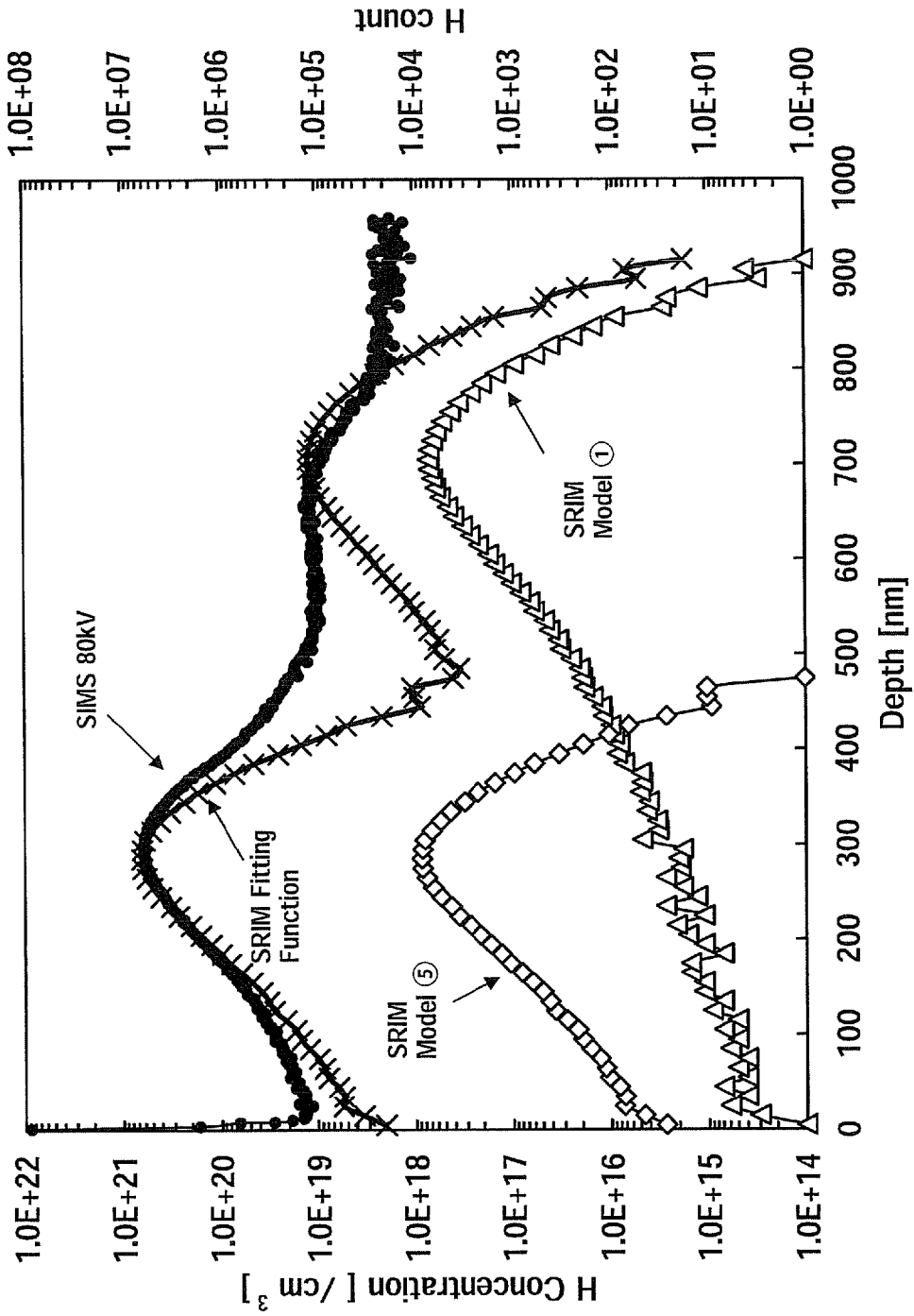
FIG. 25 is a diagram showing the profile (measured values, calculated values, and fitting function) of hydrogen in the depth direction when the accelerating voltage is 80 kV.
Figure 26:
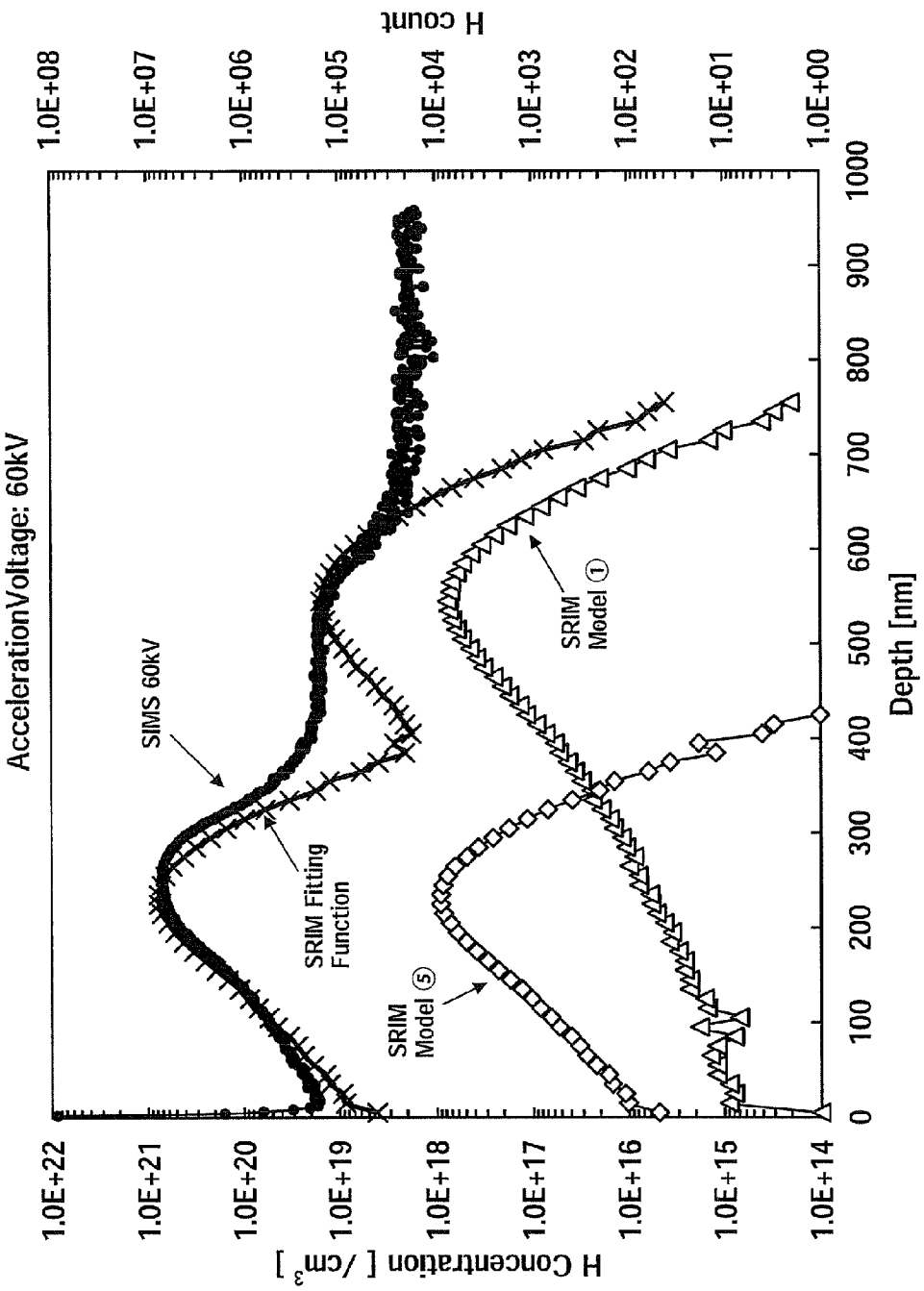
FIG. 26 is a diagram showing the profile (measured values, calculated values, and fitting function) of hydrogen in the depth direction when the accelerating voltage is 60 kV.
Figure 27:
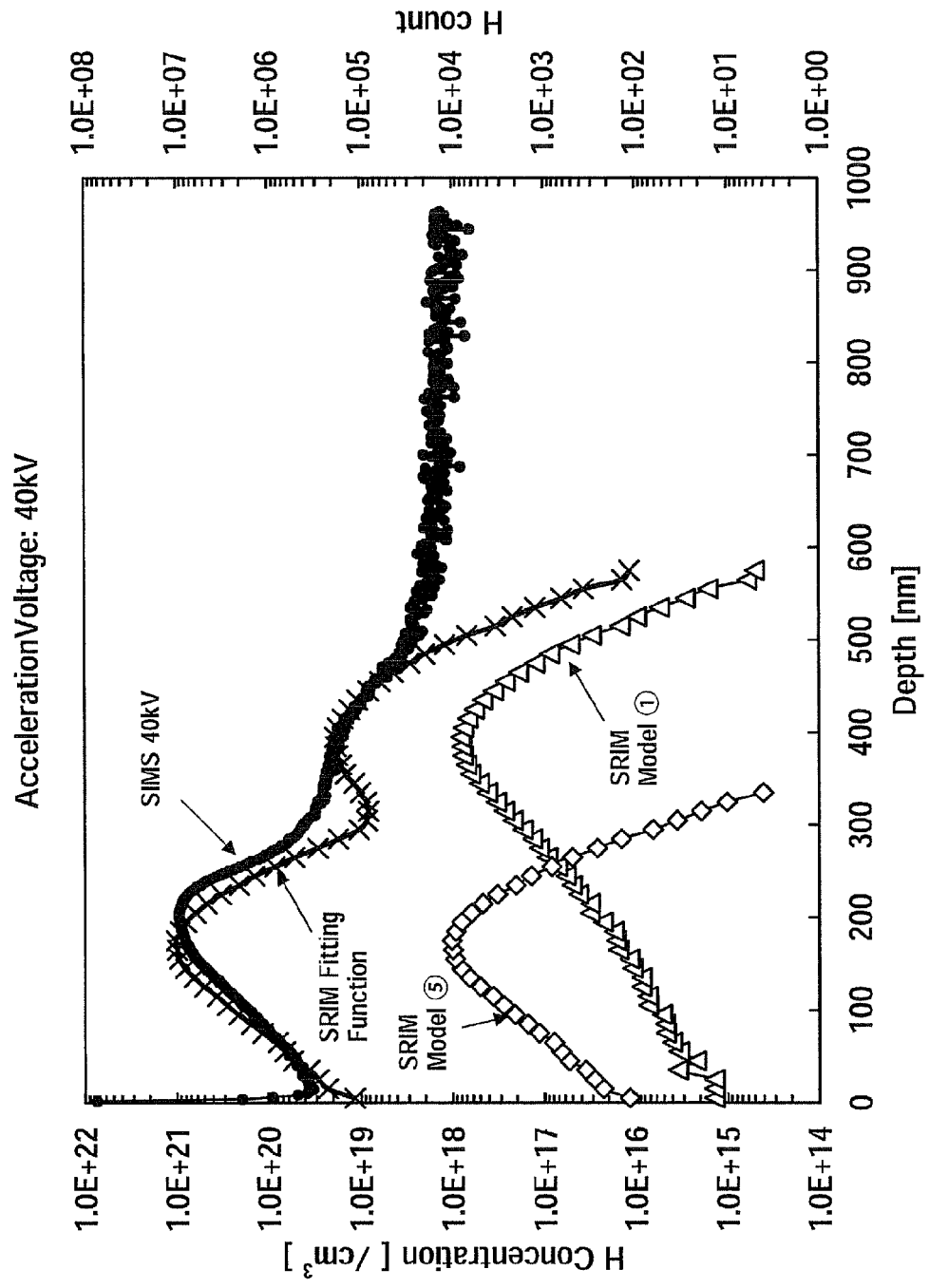
FIG. 27 is a diagram showing the profile (measured values, calculated values, and fitting function) of hydrogen in the depth direction when the accelerating voltage is 40 kV.

As a result of the consideration above, Models 2 to 4 will not be considered hereinafter. FIGS. 25 to 27 each show the calculation results obtained when irradiation with the hydrogen ion species (irradiation with 100,000 atoms for H) is performed using Models 1 and 5. FIGS. 25 to 27 also each show the hydrogen concentration (SIMS data) in a silicon substrate irradiated with the hydrogen ion species of FIG. 22, and the simulation results fitted to the SIMS data (hereinafter referred to as a fitting function). Here, FIG. 25 shows the case where the accelerating voltage is 80 kV; FIG. 26, the case where the accelerating voltage is 60 kV; and FIG. 27, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of a silicon substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between hydrogen ion species used for actual irradiation ($H^+$ ions:$H_2^+$ ions:$H_3^+$ ions is about 1:1:8), the contribution of $H_2^+$ ions (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous silicon and the influence due to crystallinity is not considered.

FIG. 28 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of hydrogen ions used for irradiation, $H^+$ ions (Model 1) to that of $H_3^+$ ions (Model 5) is about 1:14 to 1:15 (the number of $H_3^+$ ions in Model 5, when the number of $H^+$ ions in Model 1 is defined as 1, is about 14 to 15). Considering that Model 3 is not considered and the calculation assumes amorphous silicon, it can be said that values close to that of the ratio between hydrogen ion species used for actual irradiation ($H^+$ ions:$H_2^+$ ions:$H_3^+$ ions is about 1:1:8) is obtained.

(Effects of Use of $H_3^+$ Ions)

A plurality of benefits resulting from $H_3^+$ can be enjoyed by irradiation of a substrate with hydrogen ion species with a higher proportion of $H_3^+$ ions as shown in FIG. 22. For example, because $H_3^+$ ions each split into $H^+$, H, or the like to be introduced into a substrate, ion introduction efficiency can be improved compared with the case of irradiation mainly with $H^+$ ions or $H_2^+$ ions. This leads to an improvement in SOI substrate production efficiency. In addition, because the kinetic energy of an $H^+$ ion or H after an $H_3^+$ ion splits similarly tends to be low, $H_3^+$ ions are suitable for manufacture of thin semiconductor layers.

Note that, an ion doping apparatus that is capable of irradiation with the hydrogen ion species as shown in FIG. 22 is preferably used in order to efficiently perform irradiation with $H_3^+$ ions. This is because ion doping apparatuses are inexpensive and excellent for use in large-area treatment and by irradiation with $H_3^+$ ions by use of such an ion doping apparatus, significant effects such as an increase in area, a reduction in costs, and an improvement in production efficiency can be obtained. On the other hand, if first priority is given to irradiation with $H_3^+$ ions, there is no need to interpret the present invention as being limited to the use of an ion irradiation apparatus.

This application is based on Japanese Patent Application serial no. 2007-132085 filed with Japan Patent Office on May 17, 2007, the entire contents of which are hereby incorporated by reference.

What is claimed is:

1. A method for manufacturing an SOI substrate comprising:
   irradiating a first bond substrate covered by a first insulating layer with ions so as to form a first embrittled layer at a predetermined depth in the first bond substrate;
   irradiating a second bond substrate covered by a second insulating layer with ions so as to form a second embrittled layer at the predetermined depth in the second bond substrate;
   superposing and bonding the first and second bond substrates and a base substrate to each other with the first insulating layer interposed between the first bond substrate and the base substrate and with the second insulating layer interposed between the second bond substrate and the base substrate, respectively; and heating the first and second bond substrates to be separated at the first and second embrittled layers while a first separated layer and a second separated layer are left remaining over the base substrate, wherein the first and second separated layers are part of the first and second bond substrates, respectively, and wherein each of the steps of irradiating was conducted with a tilt angle between the first or second bond substrate and the vertical direction of larger than 10° and not larger than 90°.

2. The method for manufacturing an SOI substrate according to claim 1, wherein the first and second insulating layers are formed by thermally oxidizing the bond substrate.

3. The method for manufacturing an SOI substrate according to claim 1, wherein the first and second bond substrates are single crystalline silicon.

* * * * *